United States Patent
Tangudu et al.

(10) Patent No.: US 10,050,636 B2
(45) Date of Patent: Aug. 14, 2018

(54) METHODS AND APPARATUS TO REDUCE NON-LINEARITY IN ANALOG TO DIGITAL CONVERTERS

(71) Applicant: Texas Instruments Incorporated, Dallas, TX (US)

(72) Inventors: Jawaharlal Tangudu, Bangalore (IN); Sthanunathan Ramakrishnan, Bangalore (IN); Nagarajan Viswanathan, Bangalore (IN); Pooja Sundar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/389,236

(22) Filed: Dec. 22, 2016

(65) Prior Publication Data
US 2017/0324421 A1    Nov. 9, 2017

(30) Foreign Application Priority Data
May 4, 2016    (IN) .............................. 201641015443

(51) Int. Cl.
H03M 1/06    (2006.01)
H03M 1/10    (2006.01)
H03M 1/12    (2006.01)

(52) U.S. Cl.
CPC ....... *H03M 1/0617* (2013.01); *H03M 1/1009* (2013.01); *H03M 1/1245* (2013.01)

(58) Field of Classification Search
None
See application file for complete search history.

(56) References Cited

U.S. PATENT DOCUMENTS

| 5,361,067 | A | 11/1994 | Pinckley | |
| 7,142,137 | B2* | 11/2006 | Batruni | H03M 1/0612 341/118 |
| 7,199,736 | B2* | 4/2007 | Batruni | H03F 1/32 330/136 |
| 7,978,104 | B2* | 7/2011 | Johansson | H03M 1/0626 341/120 |
| 8,825,415 | B2* | 9/2014 | Johansson | H03M 1/0626 341/118 |
| 8,952,835 | B1 | 2/2015 | Zortea | |
| 8,981,972 | B2 | 3/2015 | Shen et al. | |

(Continued)

OTHER PUBLICATIONS

Hu, Xiao et al, State-Of-the-Art in Volterra Series Modeling for ADC Nonlinearity, IEEE, Second Asis International Conference on Modeling & Simulation, May 2008.*

(Continued)

*Primary Examiner* — Howard Williams
(74) *Attorney, Agent, or Firm* — Gregory J. Albin; Charles A. Brill; Frank D. Cimino

(57) ABSTRACT

Methods and apparatus for reducing non-linearity in analog to digital converters are disclosed. An example apparatus includes an analog-to-digital converter to convert an analog signal into a digital signal; and a non-linearity corrector coupled to the analog-to-digital converter to determine a derivative of the digital signal; determine cross terms including a combination of the digital signal and the derivative of the digital signal; and determine a non-linearity term corresponding to a combination of the cross terms.

18 Claims, 13 Drawing Sheets

(56) References Cited

U.S. PATENT DOCUMENTS

| | | |
|---|---|---|
| 9,041,571 B2 | 5/2015 | Wang et al. |
| 2009/0058521 A1* | 3/2009 | Fernandez ............... H03F 1/32 330/149 |

OTHER PUBLICATIONS

Hu, Xiao et al. State-Of-the-Art in Volterra Series Modeling for ADC Nonlinearity, IEEE, Second Asis International Conference on Modeling & Simulation, May 2008 (6 pages).

\* cited by examiner

METHODS AND APPARATUS TO REDUCE NON-LINEARITY IN ANALOG TO DIGITAL CONVERTERS

FIELD OF THE DISCLOSURE

This disclosure relates generally to wireless infrastructure and, more particularly, to methods and apparatus for reducing non-linearity in analog to digital converters.

BACKGROUND

Radio frequency (RF) sampling architecture digitizes (e.g., samples) an RF signal with an analog-to-digital converter (ADC or ADC) directly, without an analog-frequency conversion to lower intermediate frequency or baseband before the RF signal is converted from analog-to-digital. ADCs may be used to replace various other components, thereby reducing materials, costs, design, space, power, etc. Accordingly, ADCs have increasingly been used in a variety of applications in recent years, including but not limited to software defined radios, radar systems, signal analyzers, cellular base stations, global positioning system receivers, etc.

SUMMARY

Examples disclosed herein reduce non-linearity in analog to digital converters. An example apparatus includes an analog-to-digital converter to convert an analog signal into a digital signal. The example apparatus further includes a non-linearity corrector coupled to the analog-to-digital converter to determine cross terms including a combination of the digital signal and the derivative of the digital signal; and determine a non-linearity term corresponding to a combination of the cross terms.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
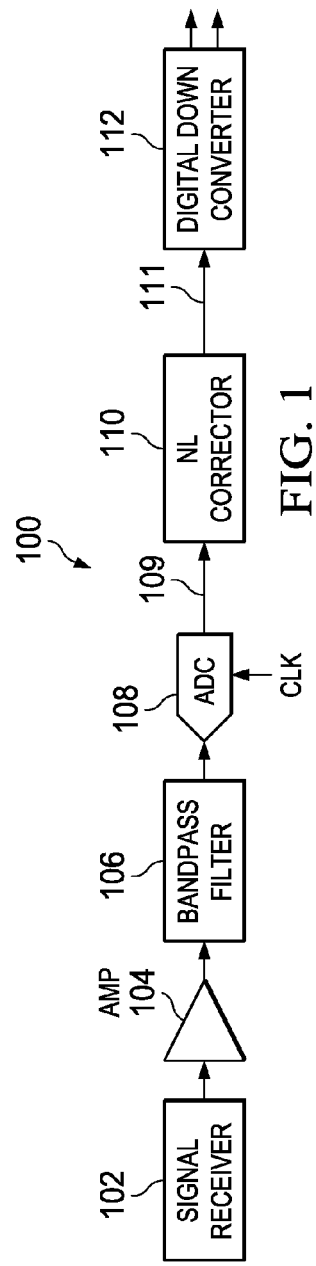
FIG. 1 is an illustration of an example radio frequency sampling architecture for reducing non-linearity in non-interleaved analog-to-digital converters.

Radio frequency (RF) sampling architectures process received analog signals to determine data corresponding to the analog signals. In some RF sampling architectures, RF analog-to-digital converters (ADCs) are used to convert an analog signal into a digital signal. In such RF sampling architectures, the ADC may be a non-interleaved ADC or an interleaved ADC. A non-interleaved ADC receives the analog signal and converts the analog signal to a digital signal using a single component ADC. An interleaved ADC interleaves multiple component ADCs, each of which sample the analog signal at different points in time to generate multiple outputs. The output of the multiple component ADCs is equivalent to the digital signal generated by an interleaved ADC. For example, if an interleaved ADC includes two component ADCs, the first component ADC will sample a received analog signal at, for example, 5 milliseconds, 15 milliseconds, 25 milliseconds, etc. and the second component ADC will sample the received analog signal at 10 milliseconds, 20 milliseconds, 30 milliseconds, etc. In this manner, the outputs of the interleaved component ADC are equivalent to a single output sampled every 5 milliseconds. Interleaved ADCs may be used to increase efficiency of the overall sampling architecture.

When an ADC samples an analog signal, the characteristics of the ADC may introduce non-linearity (NL) which typically has memory effects. Non-linearity is an impairment or deviation from a desired output of the ADC, Interleaved ADCs generate non-linearity and non-linearity mismatch. Non-linearity mismatch relates to different non-linearity of the different component ADCs. Both non-linearity and non-linearity mismatch cause unwanted harmonics (e.g., second harmonic (HD2), HD3, second intermodulation (IMD2) products, IMD3 products, etc. in the output of an ADC. The unwanted harmonics cause spikes (e.g., images) in the frequency of the output (e.g., the digital signal), thereby degrading the output of the ADC. Examples disclosed herein reduce or otherwise correct NL and NL mismatch (e.g., images caused by NL and/or NL mismatch) over a wide-band of frequencies in interleaved ADCs and non-interleaved ADCs.

For a Single Tone input at frequency fi, NL leads to images at 311 (Third Harmonic) or 2fi (Second Harmonic) and so on. Similarly, for two tone inputs at frequencies f1 and f2, a third order Non-linearity causes IMD components at 2f1−f2, 2f2−f1, 2f1+f2, 2f2+f1 along with $3^{rd}$ harmonics at 3f1 and 3f2. Second order Non-linearity causes IMD components at f1−f2, f1+f2 along with second harmonics at 2f1 and 2f2. In the interleaved ADC architecture with NL mismatches, each component ADC shows a different level of Non-linearity causing NL images in frequency domain of the corresponding NL terms (e.g. NL correction terms). For a single tone input at f1 for 4× interleaved ADC, when there is a $3^{rd}$ order NL along with third harmonic at 3f1 there will be NL images at 3f1+fs/4, 3f1+2 fs/4, 3f1+3 fs/4. Similarly, for two tone inputs at f1 and f2, every NL component in the frequency domain has its corresponding NL images (e.g., for NL component at 2f1−f2, there will be NL images at 2f1−f2+fs/4, 2f1−f2+2 fs/4, 2f1−f2+3 fs/4).

Conventional non-interleaved RF sampling architecture include conventional NL correction to determine an NL term (e.g., NL correction term) from the output of the ADC based on a Volterra series model and NL coefficients corresponding to characteristics of the ADC. The NL term corresponds to the non-linearity generated by the ADC. In such conventional NL correction, the NL term is removed from the output, thereby generating an NL corrected output addressing the memory effects. However, such conventional non-interleaved RF sampling architecture requires a large number of computations for efficient NL correction across a wide band. Examples disclosed herein reduce and/or otherwise remove non-linearity to model the received analog signal more closely than conventional non-interleaved RF sampling architectures by leveraging a cross product of a digital signal and the derivative of the digital signal along with the conventional Volterra terms, thereby reducing the total number of Volterra terms necessary to reduced NL.

In conventional interleaved ADC sampling architectures, Volterra terms are separately calculated for each of the interleaved component ADCs. Such Volterra terms use input data only from the corresponding component ADC. However, such conventional interleaved ADC sampling architectures only work for simple memory-less NL models because the analog signal sampled by the component ADCs is aliased and does not represent the complete continuous time signal. Thus, such conventional techniques cannot model continuous time NL or NL mismatch corresponding to memory effects. Examples disclosed herein include sub-NL correctors that use data from multiple component ADCs (e.g., equating to the full rate output of the interleaved ADC) using separate NL, coefficients corresponding to characteristics of a corresponding component ADC. In this manner, the NL correction terms output by the disclosed sub-NL correctors correspond to memory NL models generated at full rate over a wide input band. In some conventional correction architectures, the NL corrector is run at full rate to handle memory effects. However, such examples would not correct NL mismatches.

In some conventional interleaved RF sampling architectures, dynamic interleaving mismatch (IL) correction is performed to correct interleaving mismatch (e.g., timing mismatch, gain mismatch, etc. between component ADCs) that also causes undesired images at the output of an interleaved ADC. Intuitively, conventional IL correction is performed prior to NL correction to remove any interleaving mismatches prior to correcting the non-linearity. However, by performing IL correction prior to NL correction, the IL correction gets biased by the NL mismatch images. For example, a single tone at frequency fi when passed through a 4× interleaved ADC may cause images at fi+fs/4, for sampling frequency fs, due to both IL and NL mismatches. In such an example, performing IL correction (before NL correction) will remove the complete image due to both IL and NL mismatches. Thus, the NL correction will naturally reintroduce the NL mismatch when the NL correction is performed. Examples disclosed herein alleviate such problems by performing NL correction prior to IL correction. Examples disclosed herein are possible because the NL corrected coefficients disclosed herein are estimated off-line using specific calibration inputs.

Some examples disclosed herein reduce non-linearity in analog to digital converters. Such examples disclosed herein include an analog-to-digital converter to convert an analog signal into a digital signal. Such examples disclosed herein further include a non-linearity corrector coupled to the analog-to-digital converter to determine Volterra terms of the digital signal; determine a derivative of the digital signal; determine cross non-linearity terms (e.g., cross terms) corresponding to a product of the digital signal and the derivative of the digital signal; and determine a non-linearity term corresponding to a combination of the cross terms and the Volterra terms.

Some examples disclosed herein include an interleaved analog-to-digital converter including: a first component ADC to convert an analog signal into a first digital signal corresponding to first samples at first points in time; and a second component ADC to convert the analog signal into a second digital signal corresponding to second samples at second points in time different from the first points in time. Such example disclosed herein further include a non-linearity corrector coupled to the interleaved analog-to-digital converter to: determine a first non-linearity term corresponding to Volterra terms of the first and second digital signals, the Volterra terms scaled by first non-linearity coefficients corresponding to the first component ADC; and combine the first non-linearity term with the first digital signal to reduce first non-linearity of the first digital signal.

FIG. 1 illustrates an example sampling architecture 100 (e.g., a RF sampling architecture) disclosed herein to reduce non-linearity when processing an analog signal. The example sampling architecture 100 includes an example signal receiver 102, an example low noise amplifier 104, an example bandpass filter 106, an example ADC 108, an example digital signal 109, an example NL corrector 110, and example corrected digital signal 111, and an example digital down converter 112.

The example signal receiver 102 of FIG. 1 receives analog signals (e.g., RF signals). In some examples, the signal receiver 102 is an antenna (e.g., a dipole antenna, a monopole antenna, an array antenna, a loop antenna, etc.). In some examples, the signal receiver 102 is an input that may be coupled, or otherwise connected to a circuit that outputs a signal. After an analog signal is received by the example signal receiver 102, the signal is amplified by the example low noise amplifier 104. Alternatively, the example low noise amplifier 104 may be any type of amplifier (e.g., an operational amplifier, a class A amplifier, a class B amplifier, etc.). The example low noise amplifier 104 outputs the amplified signal to the example bandpass filter 106. The example bandpass filter 106 filters the amplified signal to remove undesired frequency bands of the signal. The filtered signal is output by the example bandpass filter 106 and received by the example ADC 108.

Figure 13:
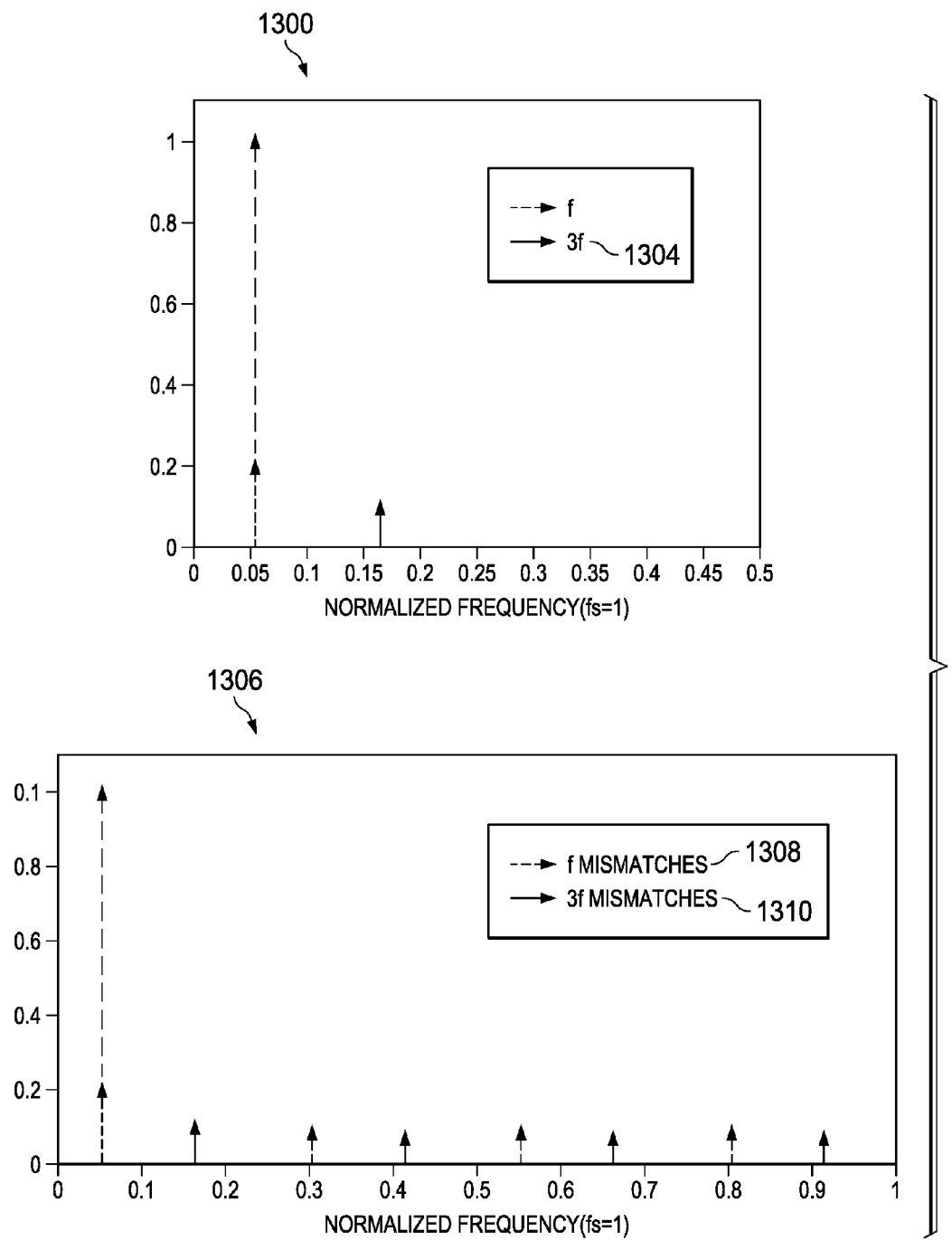
FIG. 13 is an illustration of non-linearity and non-linearity mismatch generated by analog-to-digital converters of FIGS. 1 and/or 2.

The example ADC 108 of FIG. 1 samples the filtered signal based on a clock (CLK) pulse to generate the example digital signal 109 corresponding to the filtered signal. Because there is no ideal ADC, the example ADC 108 introduces some non-linearity to the example digital signal 109, as illustrated in the example frequency graph 1300 of FIG. 13. Non-linearity causes unwanted harmonics in the digital signal 109). For example, such harmonics may include HD2 harmonics, HD3 harmonics, IMD2 harmonics, IMD3 harmonics, etc. An example harmonic (e.g., unwanted image) is illustrated in the example 3f harmonic 1304 of FIG. 13. The harmonics degrade the digital signal 109 introducing unwanted noise and decreased performance of the example sampling architecture 100. In some examples, the ADC 108 is a radio frequency analog-to-digital converter (RF ADC). The example ADC 108 outputs the digital signal 109 including the non-linearity to the example NL corrector 110.

The example NL corrector 110 of FIG. 1 reduces or otherwise eliminates the non-linearity of the digital signal 109 by combining a discrete-time derivative of the digital signal 109 and Volterra terms of the digital signal 109. The example NL corrector 110 generates the discrete-time derivative based on Nyquist zone information from a number of different frequencies. For example, if the digital signal 109 is within a first range of frequencies, the example NL corrector 110 generates the derivative of the digital signal 109 based on a first Nyquist zone corresponding to the first range of frequencies. If the digital signal 109 is within a second range of frequencies, the example NL corrector 110 generates the derivative of the digital signal 109 based on a second Nyquist zone corresponding to the second range of frequencies. The example NL corrector 110 determines multiple cross terms using both the digital signal 109 and its derivative. Additionally, the example NL corrector 110 computes Volterra terms of the digital signal 109. The example NL corrector 110 multiplies (e.g., scales) both the Volterra terms and the cross terms by NL coefficients corresponding to characteristics of the example ADC 108. The example NL corrector 110 combines the scaled Volterra terms with the scaled cross terms to generate an NL term. The NL term corresponds to the non-linearity that should be removed from the digital signal 109. The example NL corrector 110 combines the NL term with the digital signal 109 to reduce or otherwise remove the non-linearity from the digital signal 109, thereby generating the example corrected signal 111. The example corrected signal 111 of FIG. 1 is output to the example digital down converter 112. The example digital down converter 112 converts the digital signals into a Q sample and an I sample corresponding to the digital signal which may be further processed by another component and/or processor. Alternatively, the example corrected signal 111 may be forwarded to a different device or processor for further processing.

Figure 2:
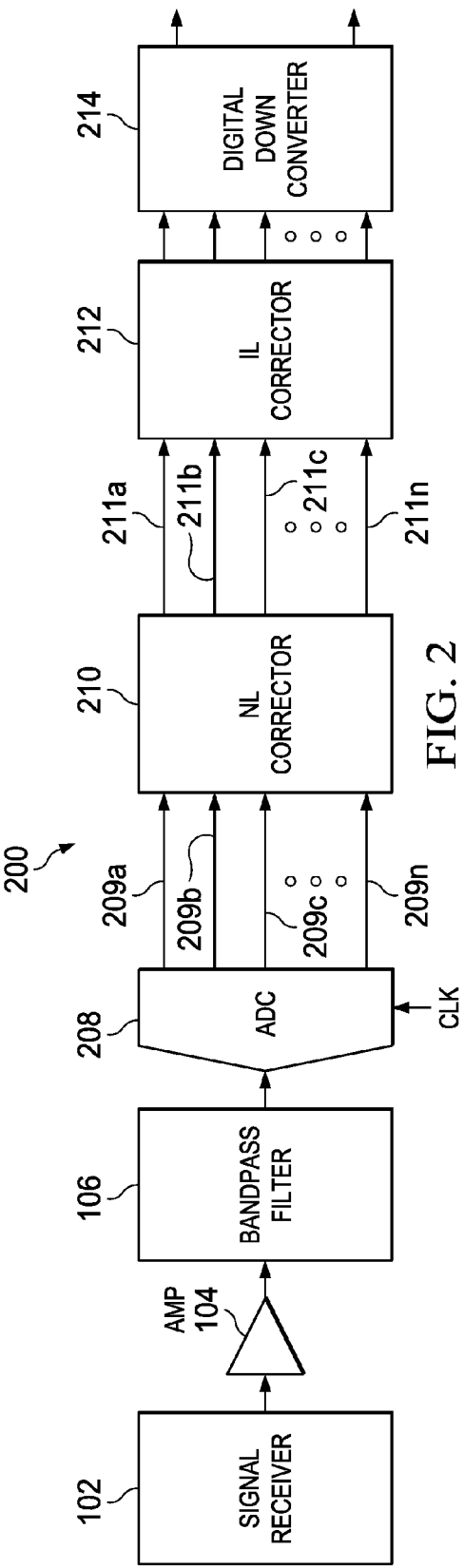
FIG. 2 is an illustration of an example radio frequency sampling architecture for reducing non-linearity and non-linearity mismatch in interleaved analog-to-digital converters.

FIG. 2 illustrates an example interleaved sampling architecture 200 (e.g., an interleaved RF sampling architecture) disclosed herein to reduce non-linearity when processing an analog signal. The example interleaved sampling architecture 200 includes the example signal receiver 102, the example low noise amplifier 104, and the example bandpass filter 106 of FIG. 1. The example interleaved sampling architecture 200 further includes an example interleaved ADC 208, example digital signals 209*a-n*, an example NL corrector 210, and example digital signals 211*a-n*, an example interleaving mismatch (IL) corrector 212, and an example digital down converter 214.

In the illustrated example of FIG. 2, the example interleaved ADC 208 outputs multiple digital signals 209*a-n* separated in time. As further described below in conjunction with FIG. 4, interleaved ADCs include a number of low-speed component ADCs that sample a signal separately at different points in time (e.g., based on the clock pulse) to generate the number of samples at the different points in time. In this manner, the output speed and number of outputs of the example interleaved ADC 208 corresponds to the number of ADC components. For example, if the example ADC 208 includes four ADC components operating at 750 mega samples per second (e.g., Msps), the example ADC 208 will operate at 3 giga samples per second (Gyps) (e.g., 4*750 Msps=3 Gsps). Additionally, the number of digital signals 209*a-n* depends on the number of ADC components of the example ADC 208. For example, when there are four component ADCs included in the example ADC 208, the example ADC 208 will output four digital samples corresponding to four subsequent point in time (e.g., the digital sample 209*a*=x(4n), the digital sample 209*b*=x(4n+1), the digital sample 209*c*=x(4n+2), etc). Each component ADC introduces a non-linearity. Thus, because the filtered signal is processed by more than one component ADC, the one or more digital samples 209*a-n* may have unique non-linearity to correct leading to non-linearity mismatch, as illustrated as the example f mismatches 1308 and the example 3f mismatches 1310 in the example frequency graph 1306 of FIG. 13. The example ADC 208 outputs the example digital samples 209*a-n* to the example NL corrector 210.

The example NL corrector 210 reduces or otherwise eliminates the non-linearity and/or non-linearity mismatch for the example digital samples 209*a-n* by processing one digital sample while using the information from the other digital samples. For example, when computing a first NL term for the first example component ADC output 209*a*, the example NL corrector 210 utilizes the other example digital samples 209*b-n* to compute the first NL term using NL coefficients corresponding to a first component ADC. When computing a second NL term for the second example ADC output 209*b*, the example NL corrector 210 utilizes the other ADC outputs 209*a, c-n* to compute the second NL term using NL coefficients corresponding to the second component ADC. In this manner, both NL, impairments and NL mismatch factor into each NL term, thereby providing a better corrected signals 211*a-n* the corrected signal 211*a-n* is a better representation of the signal received by the signal receiver 102 of FIG. 1) at a full rate (e.g., 3 Gsps). The example NL corrector 210 outputs the example corrected signals 211*a-n* to the example IL corrector 212.

The example IL corrector 212 corrects linear interleaving mismatch correction (e.g., timing mismatch, gain mismatch, etc.) by removing interleaving images. As described above, in conventional sampling architectures NL correction is done after IL correction. However, such conventional blind dynamic IL correction techniques are biased by NL mismatch images. For example, a single tone to at a first frequency (fi) may cause an image at a second frequency (e.g., fi+fs/4) due to both IL and NL mismatches. Using the conventional techniques, IL correction will remove the image and, in response, NL correct will reintroduce the NL mismatch. As illustrated in the example interleaved sampling architecture 200, the example IL corrector 212 corrects the IL mismatch after the NL mismatch have been corrected, thereby reducing or otherwise eliminating the unintentional introduction of a mismatch. The example IL corrector 212 outputs the corrected signals (e.g., NL and IL corrected signals) to the example digital down converter 214 to convert the corrected signals into a desired base-band data (e.g., I/Q Samples).

Figure 3:
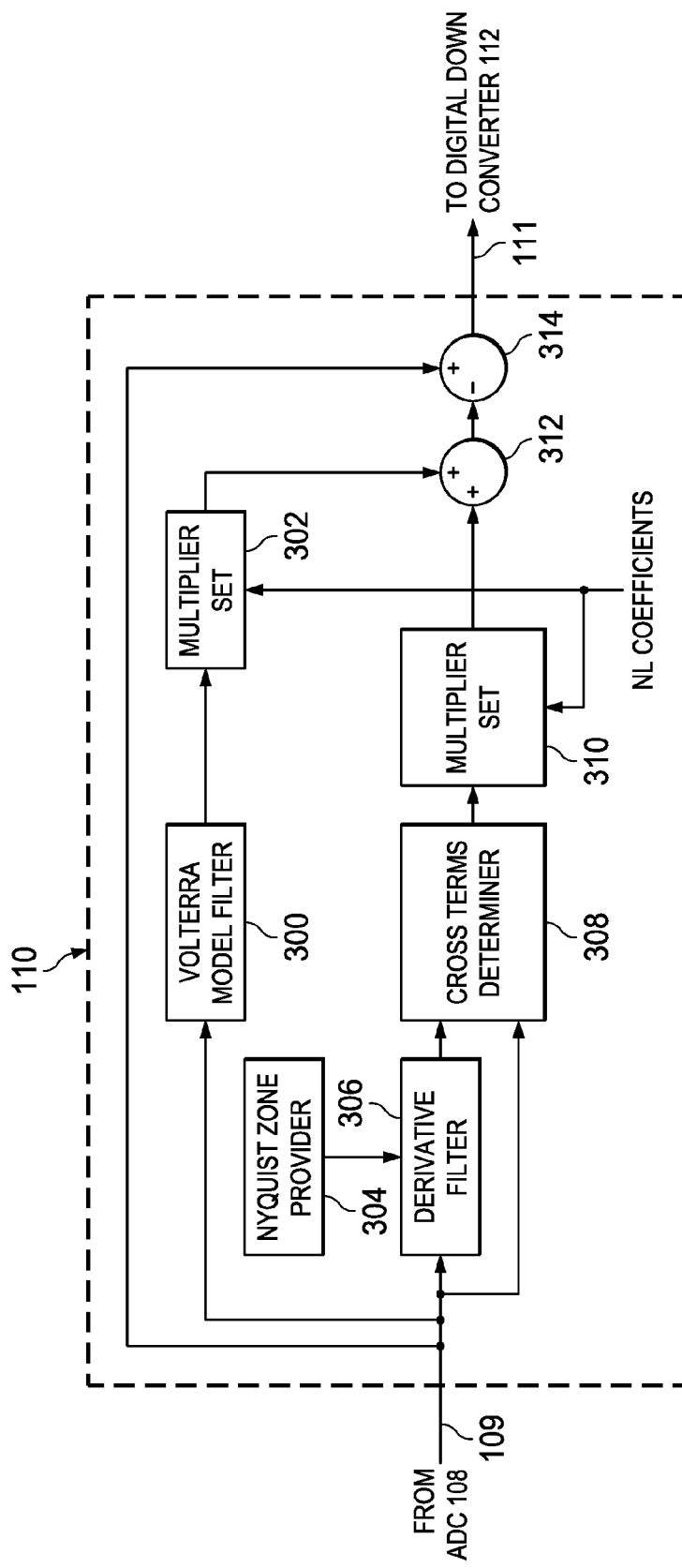
FIG. 3 is a block diagram of an example NL corrector of FIG. 1.

FIG. 3 is a block diagram of the example NL corrector 110 of FIG. 1 disclosed herein to reduce NL in the example digital signal 109 to generate the example corrected signal 111. The example NL corrector 110 includes an example Volterra model filter 300, a first example multiplier set 302, an example Nyquist zone provider 304, an example derivative filter 306, an example cross terms determiner 308, a second example multiplier set 310, and example summers 312, 314.

The example Volterra model filter 300 computes Volterra terms from the example digital signal using a Volterra series model (e.g., a Volterra model). The example Volterra terms correspond to a ith order domain model. As the order i increases, the accuracy and/or granularity of the Volterra model filter 300 output increases. Likewise, as the order decreases, the accuracy and/or granularity of the Volterra model filter 300 output decreases. Additionally, as the order i increases, the number and/or complexity of computations increases, thereby consuming lots of resources. Additionally, as the bandwidth of the example sampling architecture 100 of FIG. 1 increases, the number of computations increases create a large number of Volterra terms. The example Volterra model filter 300 may be customized to increase and/or decrease the order i based on the requirements of the example sampling architecture 100. The example Volterra model filter 300 outputs the Volterra terms to the example multiplier set 302.

The example multiplier set 302 multiplies Volterra terms by NL coefficients. The NL coefficients correspond to characteristics of the example ADC 108 of FIG. 1. In some examples, the NL coefficients are determined by testing the example ADC 108 at production (e.g., estimated off-line using specific calibration inputs). In some examples, the NL coefficients are dynamically determined based on monitoring characteristics of the example ADC 108. The example NL coefficients may be any positive or negative number used to scale the example Volterra terms. In some examples, the one or more of the coefficients may be zero to eliminate a Volterra term from the Volterra terms. The example multiplier set 302 outputs Volterra terms (e.g., scaled by the NL coefficients) to the example summer 312.

The example Nyquist zone provider 304 provides Nyquist zones to the example derivative filter 306. The example Nyquist zones include data corresponding to derivatives of signals at different frequency. For example, the example Nyquist zone provider 304 may provider the example derivative filter 306 with (A) a Nyquist zone corresponding to a first frequency range between 0-fs/2 when the example digital signal is within the first frequency range, (B) a Nyquist zone corresponding to a second frequency range between fs/2-fs, when the example digital signal is within the second frequency range, etc. An example of Nyquist zones described below in conjunction with FIG. 7. The example Nyquist zone provider 304 may include storage (e.g., a database of Nyquist Zones) and/or may be coupled to storage.

The example derivative filter 306 filters the example digital signal 109 to determine the derivative of the example digital signal 109. The example derivative filter 306 is a discrete time digital filter. In some examples, the example derivative filter 306 is a finite impulse response (FIR) filter. In some examples, the derivative filter 306 is an infinite impulse response (IIR) filter. The example derivative filter 306 response depends on the frequency range of the example digital signal 109, the derivative filter 306 computes the derivative of the example digital signal 109 using the criteria from the Nyquist zone provided by the example Nyquist zone provider 304. The example derivative 306 outputs the derivative of the digital signal 109 to the example cross terms determiner 308. The example cross terms determiner 308 calculates the cross term between the digital signal 109 and the derivative of the digital signal 109. Any specific cross term can be a product of multiple delayed versions of the digital signal and multiple delayed versions of the derivative signal. For example, if the digital signal 109 is denoted as x(n) and its derivative is denoted as xd(n), the example cross terms of third order may be x(n)*x(n)*xd(n), x(n)*xd(n)*xd(n), x(n−l1)*x(n−l2)*xd(n−l3), x(n−l1)*xd(n−l2)*xd(n−l3), xd(n−l1)*xd(n−l2)*xd(n−l3) where l1, l2, and l3 are delays (or lags) which can take any values. Similarly, example cross terms of second order are x(n)*xd(n), xd(n)*xd(n), x(n−l1)*xd(n−l2), xd(n−l1)*xd(n−l2), xd(n−l1)*xd(n−l2). Additionally or alternatively, cross terms can be generated for any order.

The example multiplier set 310 multiplies cross terms by NL coefficients (e.g., similar to NL coefficients provided to the example multiplier set 302). As described above, the NL coefficients correspond to characteristics of the example ADC 108 of FIG. 1. The example NL coefficients may be any positive or negative number used to scale the example cross terms. In some examples, the one or more of the coefficients may be zero to eliminate a cross term from the cross terms. The example multiplier set 310 outputs cross terms (e.g., scaled by the NL coefficients) to the example summer 312.

The example summer 312 combines the scaled cross terms to the scaled Volterra terms to generate a NL term (e.g., representative of the non-linearity of the example digital signal 109). The NL term generated by the example summer 312 models the analog signal received by the example signal receiver 102 of FIG. 1 closer than conventional NL terms generated solely using Volterra terms. An NL term including a combination of cross terms and Volterra terms generates similar and/or better results that an NL term using only Volterra terms. Accordingly, calculating the example NL term using cross terms requires less resources because determining the derivative signal and cross terms of a signal requires far less resources than computing all the Volterra terms required for modelling the NL. Thus, the NE term generated at the output of the example summer 312 is corresponds to a wider band of frequencies than conventional techniques. Once the NL term has been output by the example summer 312, the example summer 314 removes the NL term from the example digital signal 109 to generate the example corrected signal 111. As described above, the example corrected signal 111 corresponds to the example digital signal 109 after the NL have been reduced and/or removed.

An example of the corrected signal 111 for a third order NL correction is y(n)=x(n)+y$_3$(n)+d$_3$(n), where y$_3$(n) corresponds to Equation 1 and d$_3$(n) corresponds to Equation 2.

$$y_3(n) = \sum_{k_1=-1}^{1} \sum_{k_2=k_1}^{1} \sum_{k_3=k_2}^{1} c_3(k_1, k_2, k_3) x(n-k_1) x(n-k_2) x(n-k_3) \quad \text{(Equation 1)}$$

$$d_3(n) = \sum_{k_1=-1}^{1} \sum_{k_2=k_1}^{1} \sum_{k_3=k_2}^{1} g_3(k_1, k_2, k_3) \quad \text{(Equation 2)}$$

$$x(n-k_1)x(n-k_2)x_d(n-k_3) + \ldots$$

$$\sum_{k_1=-1}^{1} \sum_{k_2=k_1}^{1} \sum_{k_3=k_2}^{1} e_3(k_1, k_2, k_3) x(n-k_1)$$

$$x_d(n-k_2)x_d(n-k_3) + \ldots$$

$$\sum_{k_1=-1}^{1} \sum_{k_2=k_1}^{1} \sum_{k_3=k_2}^{1} f_3(k_1, k_2, k_3) x_d(n-k_1)$$

$$x_d(n-k_2)x_d(n-k_3)$$

Where $x_d(n)$ is the derivative of $x(n)$, $y_3(n)$ is the scaled Volterra terms output by the example multiplier 302, $d_3(n)$ is the scaled cross terms output by the example multiplier 310, $c_3(k_1, k_2, k_3)$, $g_3(k_1, k_2, k_3)$, $e_3(k_1, k_2, k_3)$, and $f_3(k_1, k_2, k_3)$ are the NL coefficients. Although the above example corrector signal 111 is described in conjunction with a third order NL correction, any other order correction may alternatively be used.

Figure 4:
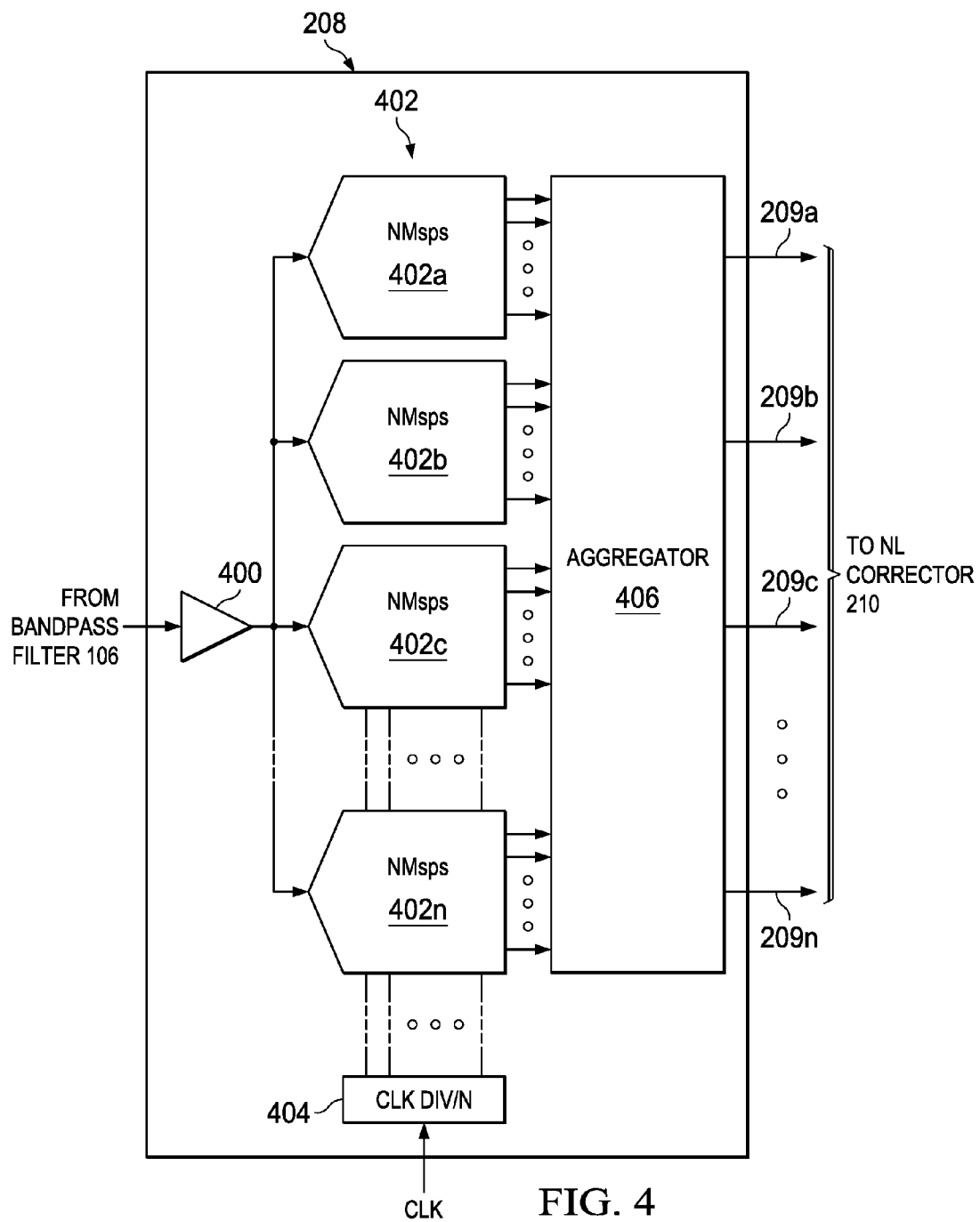
FIG. 4 is a block diagram of an example interleaved analog-to-digital converter of FIG. 2.

FIG. 4 is a block diagram of the example interleaved ADC 208 of FIG. 2, disclosed herein to receive a filtered analog signal from the example bandpass filter 126 of FIG. 1 and generate the example digital signals 209a-n of FIG. 2. The example ADC 208 includes an example buffer 400, example component ADCs 402a-n, an example clock divider 404, and an example aggregator 406. In the illustrated example ADC 208, there are n number of component ADCs operating at N Msps where n and N are integers greater than one.

The example buffer 400 receives the filtered analog signal from the example bandpass filter 106 and provides the filtered analog signal to the example component ADCs 402a-n. In the illustrated example of FIG. 4, the example component ADCs 402a-n have substantially similar bandwidth (e.g., N Msps). Alternatively, the example component ADCs 402a-n may have different bandwidths. As described above in conjunction with FIG. 2, the full bandwidth of the example ADC 208 is equivalent to the sum of the bandwidths of the n example component ADCs 402a-n. For example, if in the illustrated example, N=500 Msps and there are 5 component ADCs 402a-e, the full bandwidth of the example ADC 208 is 2.5 Gsps (e.g., 500 Msps×5). The example component ADCs 402a-n sample the filtered signal based on the clock signal received by the example clock divider 404. In this manner, each component ADCs 402a-n samples at a different point in time. For example, the first component ADC 402a corresponds to every nth sample (e.g., if the filtered signal is f(x), the output of the first component ADC is f(n*x)), the second component ADC 402b corresponds to every nth-+1 sample (e.g., f(n*x+1)), the third component ADC 402c corresponds to every nth+2 sample (e.g., f(n*x+2)), etc.

The example clock divider 404 outputs a signal to the example component ADCs 402a-n to activate the example component ADCs 402a-n to sample the filtered signal based on a received clock signal. For example, the example clock divider 404 may (A) activate the first example component ADC 402a at a first pulse (e.g., rising edge) of the clock signal, (B) activate the second example component ADC 402b at the second pulse of the clock signal, etc. until all the component ADCs 402 402a-n have been activated and then the example clock divider 440 repeats the process.

The example aggregator 406 aggregates the samples of the example component ADCs 402 to generate component ADC outputs corresponding to the samples from each of the example component ADCs 402. For example, the example aggregator 406 outputs (A) the first component ADC output 209a corresponding to every nth samples of the filtered signal (e.g., f(n*x)), (B) the second component ADC output 209b corresponding to every nth+1 samples of the filtered signal (e.g., f(n*x+1)), etc. In this manner, the example component ADC outputs 209a-n, when combined, are equivalent to the entire digital signal (e.g., f(n*x)+f(n*x+1)+ . . . +f(n*x+n−1)=f(x)).

Figure 5:
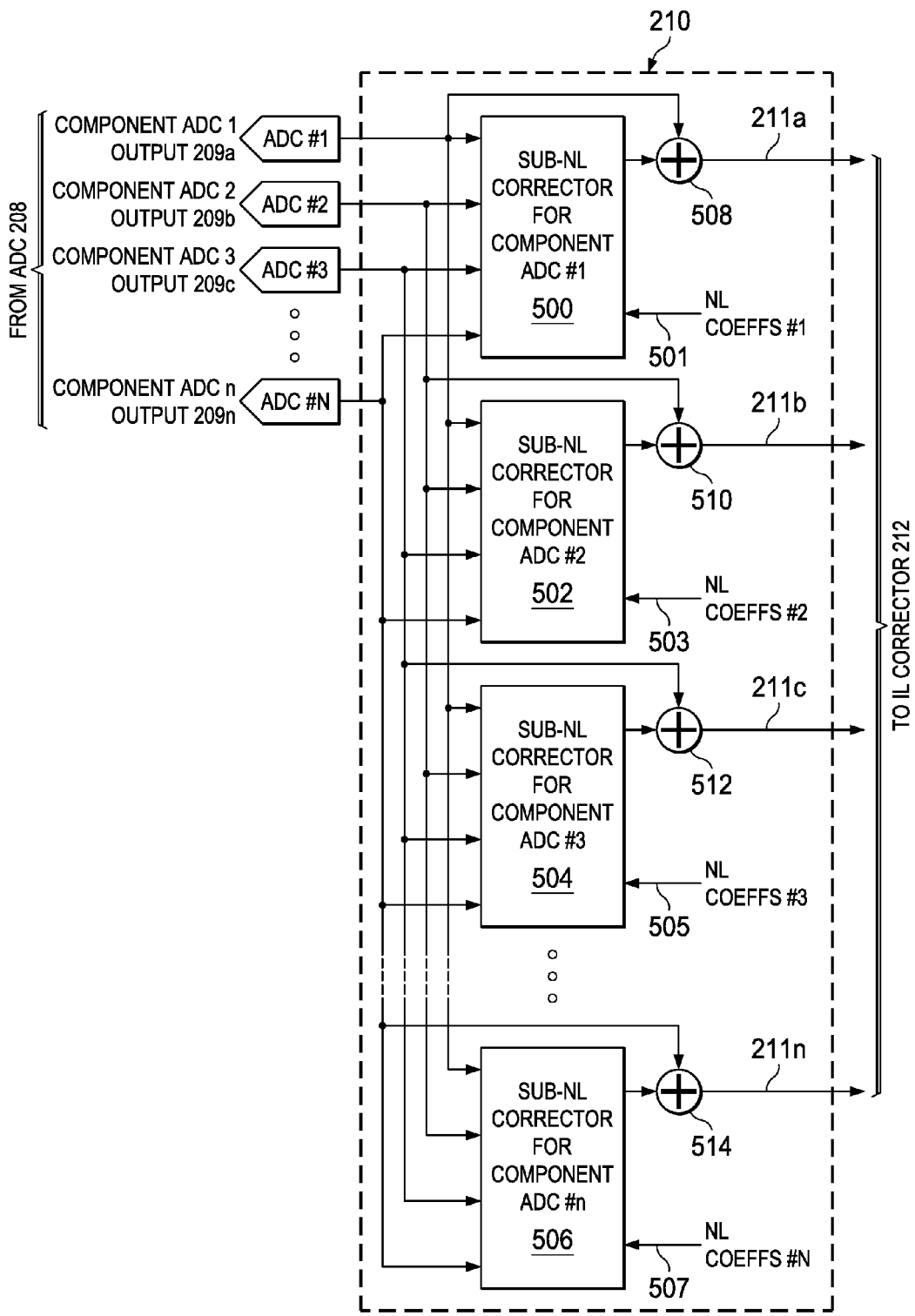
FIG. 5 is a block diagram of an example NL corrector of FIG. 2.

FIG. 5 illustrates a block diagram of the example NL corrector 210 of FIG. 2, disclosed herein, to reduce and/or otherwise eliminate the non-linearity and non-linearity mismatch of a received digital signal (e.g., the example component ADC outputs 209a-n), thereby generating the example corrected signals 211a-n. The example NL corrector 210 includes example sub-NL correctors 500, 502, 504, 506, example NL coefficients 501, 503, 505, 507, and example summers 508, 510, 512, 514.

The first example sub-NL corrector 500 computes the NL term (e.g., representative of NL impairments and/or NL mismatch) corresponding to the example first component ADC 402a of FIG. 4, the second example sub-NL corrector 502 computes the NL term corresponding to the second component ADC 402b of FIG. 4, the third example sub-NL corrector 504 computes the NL term corresponding to the third component ADC 402c of FIG. 4, and the nth example sub-NL corrector 506 computes the NL term corresponding to the nth component ADC 402n of FIG. 4. As shown in the illustrated example NL corrector 210, the example sub-NL correctors 500, 502, 504, 506 receive not only the output of the corresponding component ADC, but also the outputs of the other component ADCs. For example, the first example sub-NL corrector 500 receives the first example component ADC output 209a and the component ADC outputs 209b-n. In this manner, the example first example sub-NL corrector 500 can correct NL impairments of the first component ADC over the whole signal bandwidth. In some examples, the sub-NL correctors 500, 502, 504, 506 compute the NL term by computing the Volterra terms of the example component ADC outputs 209a-n. In some examples, as further described in conjunction with FIG. 6, the sub-NL correctors 500, 502, 504, 506 compute the NL terms by combining the Volterra terms with cross terms (e.g., a cross product between the example component ADC outputs 209a-n and their derivative).

The example sub-NL correctors 500, 502, 504, 506 receive the example NL coefficients 501, 503, 505, 507 corresponding to characteristics of the component ADCs 402a-n of FIG. 4. For example, the first example sub-NL corrector 500 receives the first NL coefficients 501 corresponding to the first component ADC 402a, the second example sub-NL cone for 502 receives the second NL coefficients 503 corresponding to the second component ADC 402b, etc. The example NL coefficients 501, 503, 505, 507 are applied to the Volterra terms and/or the cross terms generated by the example sub-NL correctors 500, 502, 504, 506.

Once the example sub-NL correctors 500, 502, 504, 506 output the computed NL term, the example summers 508, 510, 512, 514 remove the NL term from the corresponding component ADC output 209a-n, resulting in the example corrected outputs 211a-n. As described above in conjunction with FIG. 2, the example corrected outputs 211a-n represent a digital signal of the received analog signal with reduced and/or otherwise removed non-linearity and non-linearity mismatch.

Figure 6:
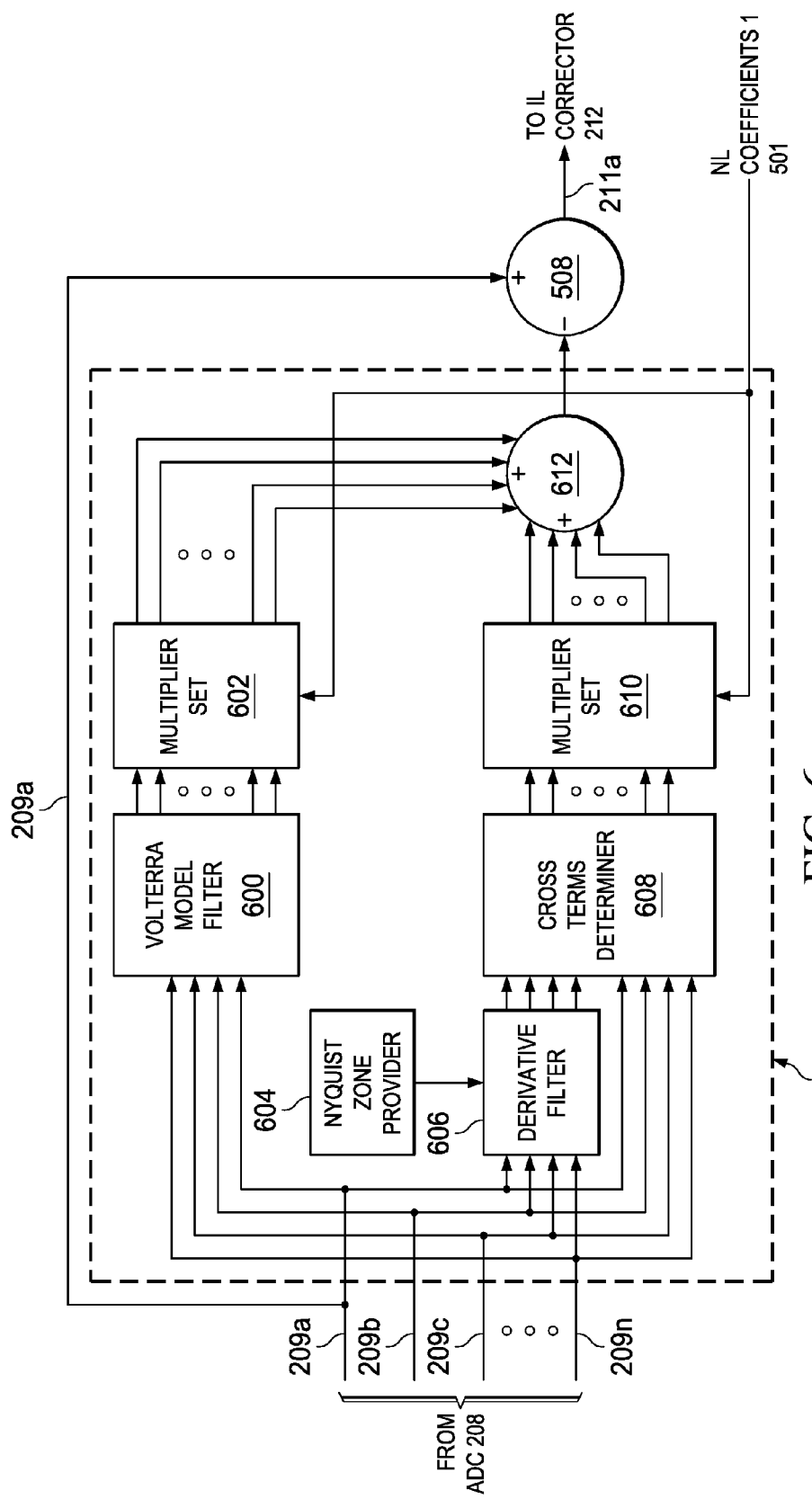
FIG. 6 is a block diagram of a first example sub-NL corrector for a first component analog-to-digital converter of FIG. 5

FIG. 6 is a block diagram of the first example sub-NL corrector 500, described herein, to reduce or otherwise remove non-linearity and non-linearity mismatch of the example interleaved ADC 208 of FIGS. 2 and 4. The first example sub-NL corrector 500 includes the example component ADC outputs 209a-n, the first example NL coefficients 1 501 (e.g., corresponding to the first component ADC 402a of FIG. 4), and the example summer 508 of FIG. 5. The first example sub-NL corrector 500 further includes an example Volterra model filter 600, an example multiplier set 602, an example Nyquist zone provider 604, an example derivative filter 606, an example cross terms determiner 608, an example multiplier set 610, and an example summer 612. Although the first example sub NL corrector 500 receives data from all component ADC outputs 209a-n, the example sub-NL corrector 500 may receive any number of outputs corresponding to any number of component ADCs.

The example Volterra model filter 600 computes Volterra terms from the example full rate (e.g., aggregated) component ADC outputs 209a-n using a Volterra series. The example Volterra terms correspond to a ith order domain model. As the order i increases, the accuracy and/or granularity of the Volterra model filter 600 output increases. Likewise, as the order i decreases, the accuracy and/or granularity of the Volterra model filter 600 output decreases. Additionally, as the order i increases, the number and/or complexity of computations increases, thereby consuming lots of resources. Additionally, as the bandwidth of the example sampling architecture 100 of FIG. 1 increases, the increased number of computations creates a large number of Volterra terms. The example Volterra model filter 600 may be customized to increase and/or decrease the order i based on the requirements of the example sampling architecture 100. The example Volterra model filter 600 outputs the Volterra terms corresponding to the component ADC outputs 209a-n to the example multiplier set 602.

The example multiplier set 602 multiplies Volterra terms by the example NL coefficients 501. The example NL coefficients 501 correspond to characteristics of the first example component ADC 402a of FIG. 4. In some examples, the NL coefficients 501 are determined by testing the first component ADC 402a at production. In some examples, the NL coefficients 501 are dynamically determined by monitoring characteristics of the first component ADC 402a. The example NL coefficients 501 may be any positive or negative number used to scale the example Volterra terms. In some examples, the one or more of the NL coefficients 501 may be zero to eliminate a Volterra term from the Volterra terms. The example multiplier set 602 outputs the Volterra terms (e.g., scaled by the NL coefficients 501) to the example summer 612.

The example Nyquist zone provider 604 provides Nyquist zone information to the example derivative filter 606. For example, using an ADC with the overall sampling rate of fs, if the input signal frequencies are in the [0 fs/2] range, then the input signal is first Nyquist Zone, if the frequencies are in the range [fs/2 fs], then the input signal is in second Nyquist zone, etc. The Nyquist Zone information is used to select the appropriate digital derivative filter which will recreate the derivative signal. An example of Nyquist zones described below in conjunction with FIG. 7. The example Nyquist zone provider 604 may include storage (e.g., a database of Nyquist Zones) and/or may be coupled to storage.

The example derivative filter 606 filters the example component ADC outputs 209a-n to determine the derivative of the example digital signal 109. The example derivative filter 606 is a discrete time digital filter. In some examples, the example derivative filter 606 is a finite impulse response (FIR) filter. In some examples, the derivative filter 606 is an infinite impulse response (IIR) filter. The example derivative filter 606 filters the example full rate (e.g., aggregated) ADC outputs 209a-n based on the frequency response of the filter, the derivative filter 606 computes the derivative of the example full rate (e.g., aggregated) ADC outputs 209a-n using the criteria from the Nyquist zone provided by the example Nyquist zone provider 604. The example derivative filter 606 outputs the derivate of the equivalent full rate signal, at the corresponding time instants of component ADC outputs 209a-n to the example cross terms determiner 608. The example cross terms determiner 608 calculates the cross terms between the example component ADC outputs 209a-n and the derivative of the example component ADC outputs 209a-n.

The example multiplier set 610 multiplies cross terms by NL coefficients 501. As described above, the NL coefficients 501 correspond to characteristics of the first example component ADC 402a of FIG. 4. The example NL coefficients 501 may be any positive or negative number used to scale the example cross terms. In some examples, the one or more of the coefficients may be zero to eliminate a cross term from the cross terms. The example multiplier set 610 outputs cross terms (e.g., scaled by the NL coefficients 501) to the example summer 612.

The example summer 612 combines the scaled cross terms to the scaled Volterra terms to generate an NL term (e.g., representative of the non-linearity of the example component ADC outputs 209a-n). The NL term generated by the example summer 612 models the non-linearity component introduced by the example ADC 208 in that particular sample. Once the NL term has been output by the example summer 612, the example summer 508 removes the NL term from the first example component ADC output 209a to generate the first example corrected signal 211a. As described above, the example corrected signal 211a corresponds to the example component ADC output 209a after the NL have been reduced or removed.

In some examples, the First example sub-NL corrector 500 may be implemented without the example Nyquist zone provider 604, the example derivative filter 606, the example cross terms determiner 608, the example multiplier set 610, and/or the example summer 612. In such example, the NL term may be based solely on the Volterra terms of the example ADC component outputs 209a-n (e.g., scaled by the example NL coefficients 501). This alternative corrector may be utilized in order to conserve board space, cost, complexity, etc.

The example sub NL correctors 502, 504, 506 share a similar structure to the example sub-NL corrector 500. For example, the second sub-NL corrector 502 may include the example Volterra model filter 600, the example multiplier set 602, the example Nyquist zone provider 604, the example derivative filter 606, the example cross terms determiner 608, the example multiplier set 610, and the example summer 612. In such examples, the second sub-NL corrector 502 differs from the illustrated sub-NL corrector 500, in that the example sub-NL corrector 502 will receive the second example NL coefficients 503 corresponding to the characteristics of the second example component ADC 402b of FIG. 4. Additionally, the NL term generated by the example summer 612 of the second example sub-NL corrector 502 will be combined with the example second component ADC output 209b.

An example of the first example corrected signal 211a for a third order NL correction is y(4n)=x(4n)+y_3(4n)+d_3(4n), where y_3(4n) corresponds to Equation 3 and d_3(4n) corresponds to Equation 4.

$$y_3(4n) = \sum_{k_1=-1}^{1} \sum_{k_2=k_1}^{1} \sum_{k_3=k_2}^{1} c_3(k_1, k_2, k_3) x(4n-k_1) x(4n-k_2) x(4n-k_3) \quad \text{(Equation 3)}$$

-continued $$d_3(4n) = \sum_{k_1=-1}^{1} \sum_{k_2=k_1}^{1} \sum_{k_3=k_2}^{1} g_3(k_1, k_2, k_3)x(4n-k_1)x(4n-k_2) \quad \text{(Equation 4)}$$

$$x_d(4n-k_3) + \ldots \sum_{k_1=-1}^{1} \sum_{k_2=k_1}^{1} \sum_{k_3=k_2}^{1} e_3(k_1, k_2, k_3)$$

$$x(4n-k_1)x_d(4n-k_2)x_d(4n-k_3) + \ldots$$

$$\sum_{k_1=-1}^{1} \sum_{k_2=k_1}^{1} \sum_{k_3=k_2}^{1} f_3(k_1, k_2, k_3)x_d(4n-k_1)$$

$$x_d(4n-k_2)x_d(4n-k_3)$$

Where $x_d(4n)$ is the derivative of $x(4n)$, $y_3(4n)$ is the scaled Volterra terms output by the example multiplier 602, $d_3(4n)$ is the scaled cross terms output by the example multiplier 610, $c_3(k_1, k_2, k_3)$, $g_3(k_1, k_2, k_3)$, $e_3(k_1, k_2, k_3)$, and $f_3(k_1, k_2, k_3)$ are the NL coefficients. Although the above example corrector signal 211*1* is described in conjunction with a third order NL correction, any other order correction may alternatively be used. Additionally, the second example corrector signal 211*b*, the third example corrector signal 211*c*, etc. are calculated in a similar manner utilizing the corresponding input signal (e.g., for the example second ADC component output 209*b*, $y(4n+1)=x(4n+1)+y_3(4n+1)+d_3(4n+1)$, for the example third ADC component output 209*c*, $y(4n+2)=x(4n+2)+y_3(4n+2)+d_3(4n+2)$, etc.).

Figure 7:
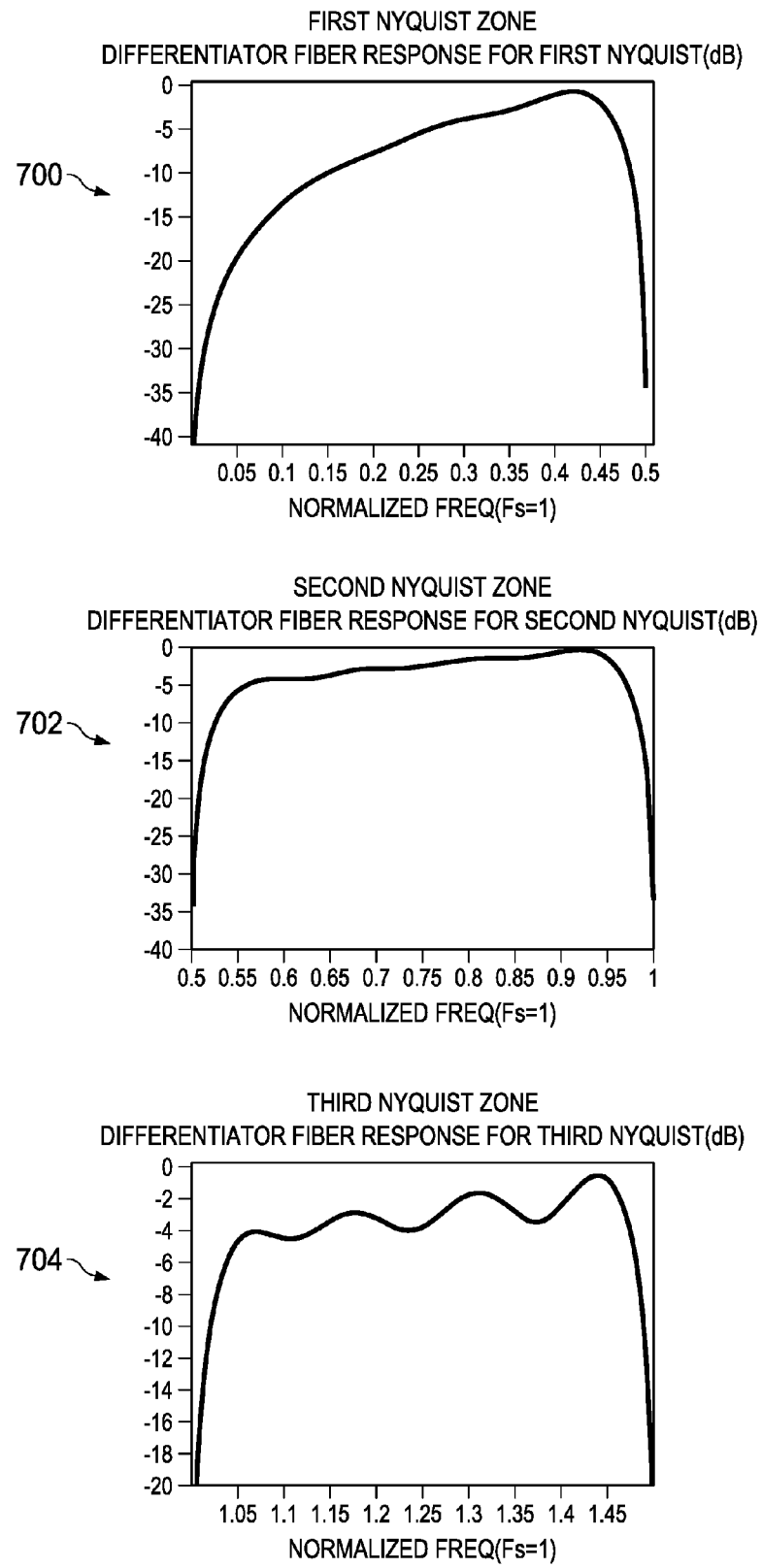
FIG. 7 illustrates an example frequency response of a digital derivative filter in example Nyquist zones used by the example NL corrector of FIGS. 2 and 5.

FIG. 7 illustrates example graphs representative the response of the example response of the example derivative filter 306, 606 in a first example Nyquist zone 700, a second example Nyquist zone 702, and a third example Nyquist zone 704. In the illustrated example of FIG. 7, for an overall sampling frequency of 3 GHz, the response in the first example Nyquist zone 700 corresponds to frequencies between 0 and 1.5 GHz, the response in the second example Nyquist zone 702 corresponds to frequencies between 1.5 GHz and 3 GHz, and the response in the third example Nyquist zone 704 corresponds to frequencies between 3-4.5 GHz. Alternatively, any number of Nyquist zones may be utilized for any frequency range.

As shown in the illustrated graph of the example response at the first Nyquist zone 700, the response increases from −40 dB at a very low normalized frequency (e.g., close to 0 Hz) to around −1 dB at around 1.2 Ghz (e.g., a normalized frequency of 0.4), before decreasing back down to around −35 dB at 1.5 GHz (e.g., a normalized frequency of 0.5). As shown in the illustrated graph of the example response at the second Nyquist zone 702, the response increases from −35 dB at a 1.5 GHz to around 0 dB at around 2.7 Ghz (e.g., a normalized frequency of 0.9), before decreasing back down to around −35 dB at 3 GHz (e.g., a normalized frequency of 1). As shown in the illustrated graph of the example response at the third Nyquist zone 704, the response increases from −20 dB at 3 GHz to around −1 dB at around 4.35 Ghz (e.g., a normalized frequency of 1.45), before decreasing back down to around −20 dB at 4.5 GHz (e.g., a normalized frequency of 1.5).

While example manners of implementing the example RF sampling architecture 100 and/or the example interleaved RF sampling architecture 200 are illustrated in FIGS. 1-6, elements, processes and/or devices illustrated in FIGS. 1-6 may be combined, divided, re-arranged, omitted, eliminated and/or implemented in any other way. Further, the example signal receiver 102, the example amplifier 104, the example bandpass filter, the example ADC 108, the example NL corrector 110, the example digital down converter 112, the example ADC, 208, the example NL corrector 210, the example IL corrector 212, the example digital down converter 214, and/or more generally the example RF sampling architecture 100 and/or the example interleaved RF sampling architecture 200 of FIGS. 1-6 may be implemented by hardware, machine readable instructions, software, firmware and/or any combination of hardware, machine readable instructions, software and/or firmware. Thus, for example, any of the example signal receiver 102, the example amplifier 104, the example bandpass filter, the example ADC 108, the example NL corrector 110, the example digital down converter 112, the example ADC 208, the example NL corrector 210, the example IL corrector 212, the example digital down converter 214, and/or more generally the example RF sampling architecture 100 and/or the example interleaved RF sampling architecture 200 of FIGS. 1-6 could be implemented by analog and/or digital circuit(s), logic circuit(s), programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example signal receiver 102, the example amplifier 104, the example bandpass filter, the example ADC 108, the example NL corrector 110, the example digital down converter 112, the example ADC 208, the example NL corrector 210, the example IL corrector 212, the example digital down converter 214, and/or more generally the example RF sampling architecture 100 and/or the example interleaved RF sampling architecture 200 of FIGS. 1-6 is/are hereby expressly defined to include a tangible computer readable storage device or storage disk such as a memory, a digital versatile disk (DVD), a compact disk (CD), a Blu-ray disk, etc. storing the software and/or firmware. Further still, the example signal receiver 102, the example amplifier 104, the example bandpass filter, the example ADC 108, the example NL, corrector 110, the example digital down converter 112, the example ADC 208, the example NL corrector 210, the example IL corrector 212, the example digital down converter 214, and/or more generally the example RF sampling architecture 100 and/or the example interleaved RF sampling architecture 200 of FIGS. 1-6 includes elements, processes and/or devices in addition to, or instead of, those illustrated in FIGS. 1-6, and/or may include more than one of any or all of the illustrated elements, processes and devices.

Flowcharts representative of example machine readable instructions for implementing the example RF sampling architecture 100 and/or the example interleaved RF sampling architecture 200 are illustrated in FIGS. 1-6 is shown in FIGS. 8-13. In the examples, the machine readable instructions comprise a program for execution by a processor such as the processor 1412, 1512 shown in the example processor platform 1400, 1500 discussed below in connection with FIGS. 14 and 15. The program may be embodied in machine readable instructions stored on a tangible computer readable storage medium such as a CD-ROM, a floppy disk, a hard drive, a digital versatile disk (DVD), a Blu-ray disk, or a memory associated with the processor 1412, 1512 but the entire program and/or parts thereof could alternatively be executed by a device other than the processor 1412, 1512 and/or embodied in firmware or dedicated hardware. Further, although the example program is described with reference to the flowcharts illustrated in FIGS. 14 and 15, many other methods of implementing the example RF sampling architecture 100 and/or the example interleaved RF sampling architecture 200 are illustrated in FIGS. 1-6 may alternatively be used. For example, the order of execution of the blocks may be changed, and/or some of the blocks described may be changed, eliminated, or combined.

As mentioned above, the example processes of FIGS. 8-12 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 8-12 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

Figure 8:
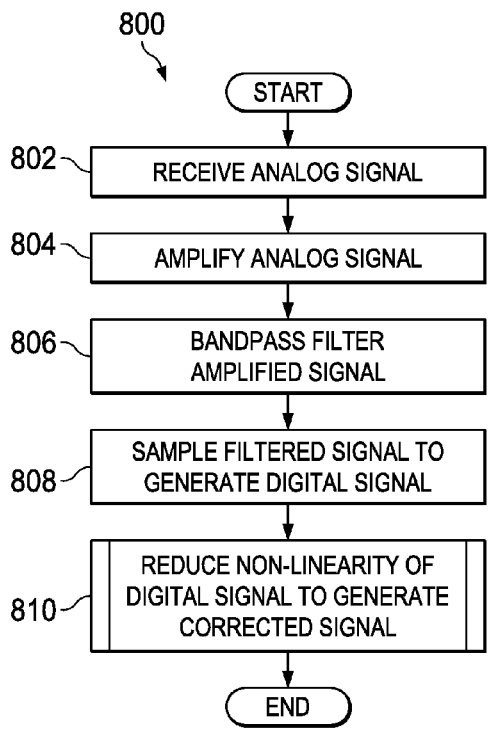
FIG. 8 is a flowchart representative of example machine readable instructions that may be executed to implement the example NL corrector of FIG. 3.

FIG. 8 is an example flowchart 800 representative of example machine readable instructions that may be executed by the example sampling architecture 100 of FIG. 1 to reduce non-linearity of an analog signal sampled by the example ADC 108 of FIG. 1. Although the example flowchart 800 is described in conjunction with the example sampling architecture 100 of FIG. 1, the flowchart 800 used to implement any type of sampling architecture.

At block 802, the example signal receiver 102 receives an analog signal. At block 804 the example amplifier 104 amplifies the received analog signal. At block 806, the example bandpass filter 106 bandpass filters the amplified signal. The example bandpass filter 106 filters the amplified signal to remove high and/or low frequencies corresponding to noise. The example filtered amplified signal may be x(t), for example.

At block 808, the example ADC 108 samples the filtered signal, x(t), to generate the example digital signal 109, x(n). As described above in conjunction with FIG. 1, the example digital signal 109 corresponds to samples of the filtered signal based on pulses from a clock signal. When the example ADC 108 samples the filtered signal, x(t), the example ADC 108 introduces undesired non-linearity into the example digital signal 109, x(n).

At block 810, the example NL corrector 110 reduces the non-linearity of the example digital signal 109, x(n), to generate the example corrected signal 111, y(n). The example NL corrector 110 reduces the non-linearity by generating an NL correction term corresponding to the non-linearity generated by the example ADC 108 and removing the NL correction term from the example digital signal 109, x(n). As further described in conjunction with FIG. 9, the example NL corrector 110 reduces the non-linearity of the example digital signal 109, x(n), by combining the cross term which use both x(n) and the derivative of x(n) (e.g., x'(n)) with Volterra terms of the example digital signal, x(n), thereby generating the example corrected signal 111 of FIG. 1, y(n). In some examples, the corrected signal, y(n), is equivalent to the Equation 5.

$$y(n)=x(n)-\alpha x^3(n)-\Omega^* x(n)^* x^2(n-1)-\beta x'(n) x^2(n-1) \quad \text{Equation 5}$$

Where $\alpha$, $\Omega$ and $\beta$ are NL coefficients corresponding to the example ADC 108.

Figure 9:
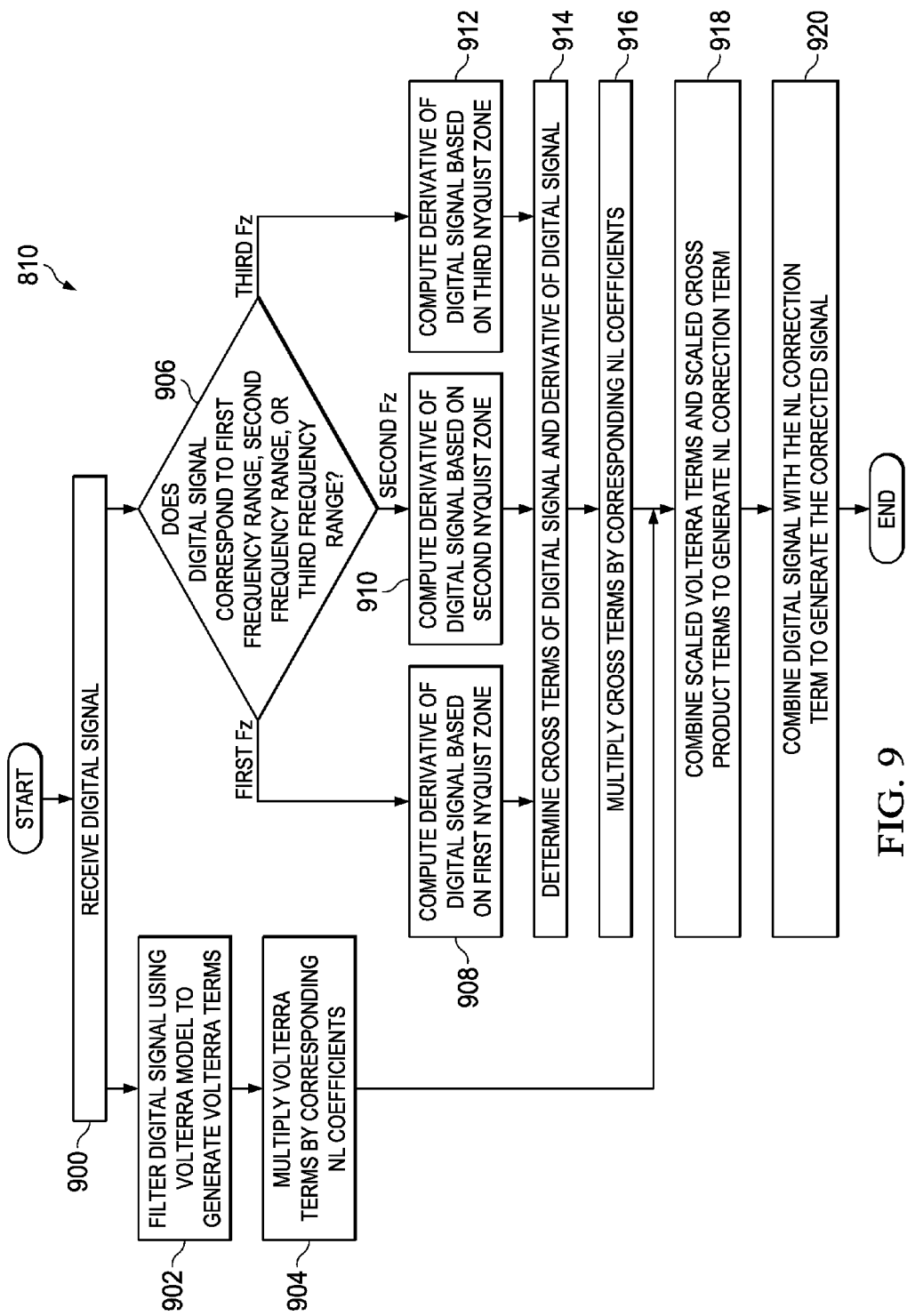
FIG. 9 is a flowchart representative of example machine readable instructions that may be executed to implement the example NL corrector of FIG. 3.

FIG. 9 is an example flowchart 810 representative of example machine readable instructions that may be executed to implement the example signature NL corrector 110 of FIGS. 1 and 3 to reduce non-linearity of the example digital signal 109 to generate the example corrected signal 111 of FIGS. 1 and 3. Although the example flowchart 810 corresponds to the example NL corrector 110 of FIGS. 1 and 3, the example flowchart 810 may be utilized for any type of NL correction device.

At block 900, the example NL corrector 110 receives the example digital signal 109 output by the example ADC 108. The example digital signal 109 is a digital representation of an analog signal (e.g., received by the example signal receiver 102 of FIG. 1. As described above, the example ADC 108 generates undesired non-linearity in the digital signal 109. As illustrated in the example NL corrector 110 of FIG. 3, the received digital signal 109 is distributed to the example Volterra model filter 300, the example derivative filter 306, and the example cross terms determiner 308.

At block 902, the example Volterra model filter 300 filters the received digital signal 109 using a Volterra model (e.g., of any order) to generate Volterra terms. At block 904 multiplies (e.g., scales) the generated Volterra terms by corresponding NL coefficients. As described above in conjunction with FIG. 3, the NL correction terms correspond to characteristics of the example ADC 108. In some examples, the scaled Volterra terms (V(n)) is equivalent to the Equation 6, in an example second order Volterra model.

$$V(n)=\alpha x^3(n)+\Omega^* x(n)^* x^2(n-1) \quad \text{(Equation 6)}$$

Where $\alpha$ and $\Omega$ are NL coefficients corresponding to the example ADC 108.

At block 906, the example Nyquist zone provider 304 if the digital signal 109 corresponds to a first frequency range, a second frequency range, or a third frequency range. In some examples, there may be more or less frequency ranges identified by the example Nyquist zone provider 304. If the example Nyquist zone provider 304 determines that the frequency of the digital signal 109 corresponds to the first frequency range, the example derivative filter 206 computes the derivative of the digital signal 109 based on the first Nyquist zone (e.g., the first example Nyquist zone 700 of FIG. 7) (block 908). If the example Nyquist zone provider 304 determines that the frequency of the digital signal 109 corresponds to the second frequency range, the example derivative filter 206 computes the derivative of the digital signal 109 based on the second Nyquist zone (e.g., the second example Nyquist zone 702 of FIG. 7) (block 910). If the example Nyquist zone provider 304 determines that the frequency of the digital signal 109 corresponds to the third frequency range, the example derivative filter 206 computes the derivative of the digital signal 109 based on the third Nyquist zone (e.g., the third example Nyquist zone 704 of FIG. 7) (block 912).

At block 914, the example cross terms determiner 308 determines the cross terms based on the cross product of the example digital signal 109 and the derivative of the digital signal output by the example derivative filter 306. At block 916, the example multiplier set 310 multiplies (e.g. scales) the cross terms by corresponding NL coefficients. In some examples, the scaled cross terms (CP) are equivalent to the Equation 7, in an example second order derivative.

$$CP = \beta x'(n) x^2(n-1) \qquad \text{(Equation 7)}$$

Where x'(n) is the derivative of the example digital signal 109.

At block 918, the example summer 312 combines the scaled cross terms with the example scaled Volterra terms to generate an NL correction term. Using the above example terms from Equations 6 and 7, an example NL correction term is shown in Equation 8.

$$NL_{term} = \alpha x^3(n) + \Omega^* x(n)^* x^2(n-1) + \beta x'(n) x^2(n-1) \qquad \text{(Equation 8)}$$

The NL correction term is representative of the undesired non-linearity of the example digital signal 109.

At block 920, the example summer 314 combines the digital signal 109 with the generated NL correction term to generate the example corrected signal 111. The example corrected signal 111 is the digital signal 109 with the non-linearity reduced and/or otherwise removed. An example corrected ten (y(n)) is shown above in Equation 5.

Figure 10:
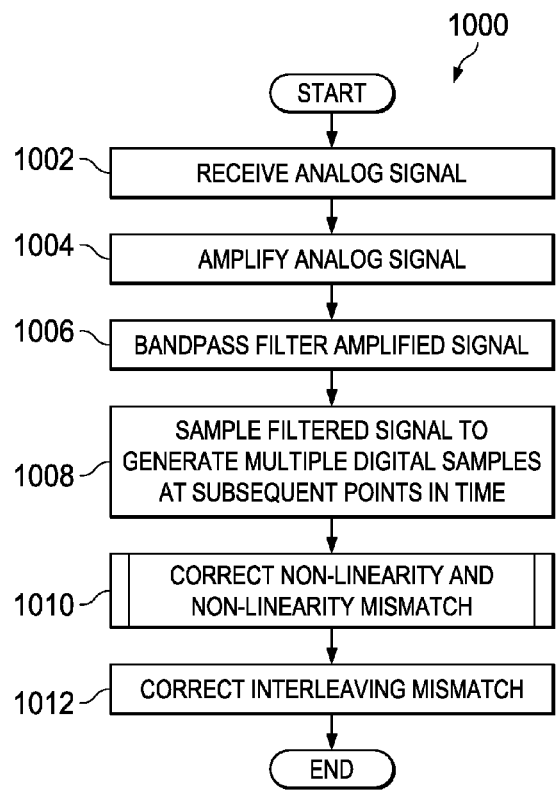
FIG. 10 is a flowchart representative of example machine readable instructions that may be executed to implement the example NL corrector of FIGS. 5 and 6.

FIG. 10 is an example flowchart 1000 representative of example machine readable instructions that may be executed by the example interleaved sampling architecture 200 of FIG. 2 to reduce non-linearity of an analog signal sampled by the example ADC 208 of FIG. 2. Although the flowchart 1000 is described in conjunction with the example interleaved sampling architecture 200 of FIG. 2, the flowchart 1000 used to implement any type of sampling architecture. The example flowchart 1000 of FIG. 10 is described in conjunction a ADC 208 with four component ADC; although, the example flowchart 1000 may be used in conjunction with any number of component ADCs.

At block 1002, the example signal receiver 102 receives an analog signal. For example, the signal receiver 102 may receive an analog signal. At block 1004 the example amplifier 104 amplifies the received analog signal. At block 1006, the example bandpass filter 106 bandpass filters the amplified signal. The example bandpass filter 106 filters the amplified signal to remove high and/or low frequencies corresponding to noise. The example filtered amplified signal may be x(t), for example.

At block 1008, the example interleaved ADC 208 samples the filtered signal, x(t), to generate the example digital signals 209a-d, x(4n), x(4n+1), x(4n+2), x(4n+3). As described above in conjunction with FIG. 2, the example digital signals 209a-d correspond to samples of the filtered signal based on pulses from a clock signal interleaved in time. When the example ADC 208 samples the filtered signal, x(t), the example ADC 208 introduces undesired non-linearity into the example digital signal 209a-d.

At block 1010, the example NL corrector 210 reduces the non-linearity and non-linearity mismatch of the example digital signal 209a-d, x(4n), x(4n+1), x(4n+2), x(4n+3), to generate the example corrected signal 211a-d, y(4n), y(4n+1), y(4n+2), y(4n+3). The example NL corrector 110 reduces the non-linearity and/or non-linearity mismatch by generating a NL correction term corresponding to the non-linearity and/or non-linearity mismatch generated by the example ADC 208 and removing the NE correction term from the example digital signal 209. In some examples, as further described in conjunction with FIG. 11, the example NL corrector 210 reduces the non-linearity and/or non-linearity mismatch of the example digital signal 209, by combining the cross product of x(4n), x(4n+1), x(4n+2), x(4n+3) and the derivative of x(n) (e.g., x'(4n), x'(4n+1), x'(4n+2), x'(4n+3)) with Volterra terms of the example digital signal, thereby generating the example corrected signal 211a-d of FIG. 2, y(4n), y(4n+1), y(4n+2), y(4n+3). In some examples, the corrected signal 211a-d, y(4n), y(4n+1), y(4n+2), y(4n+3), is equivalent to the Equations 9, 10, 11, and 12.

$$y(4n) = x(4n) - (\alpha^1 x^3(4n) + \Omega^{1*} x(4n)^* x^2(4n-1) + \beta^1 x'(4n) x^2(4n-1)) \qquad \text{(Equation 9)}$$

$$y(4n+1) = x(4n+1) - (\alpha^2 x^2(4n+1) + \Omega^{2*} x(4n+1)^* x^2(4n) + \beta^2 x'(4n+1) x^2(4n)) \qquad \text{(Equation 10)}$$

$$y(4n+2) = x(4n+2) - (\alpha^3 x^3(4n+2) + \Omega^{3*} x(4n+2)^* x^2(4n+1) + \beta^3 x'(4n+2) x^2(4n+1)) \qquad \text{(Equation 11)}$$

$$y(4n+3) = x(4n+3) - (\alpha^4 x^3(4n+3) + \Omega^{4*} x(4n+3)^* x^2(4n+2) + \beta^4 x'(4n+3) x^2(4n+2)) \qquad \text{(Equation 12)}$$

Where $\alpha^1$, $\alpha^2$, $\alpha^3$, $\alpha^4$, $\beta^1$, $\beta^2$, $\beta^3$, $\beta^4$, $\Omega^1$, $\Omega^2$, $\Omega^3$, and $\Omega^4$ are NL coefficients corresponding to the four example component ADCs 402a-d of the example ADC 108.

At block 1012, the example IL corrector 212 corrects and/or reduces the interleaving mismatch (e.g., gain mismatch, timing mismatch, etc. associated with the different component ADCs 402a-d). As described above, correcting and/or reducing the interleaving mismatch after the correcting and/or reducing the non-linearity of the example digital signals 209a-d eliminates the possibility of the example NL corrector 210 re-adding non-linearity that has been previously been removed by the example IL corrector 212.

Figure 11:
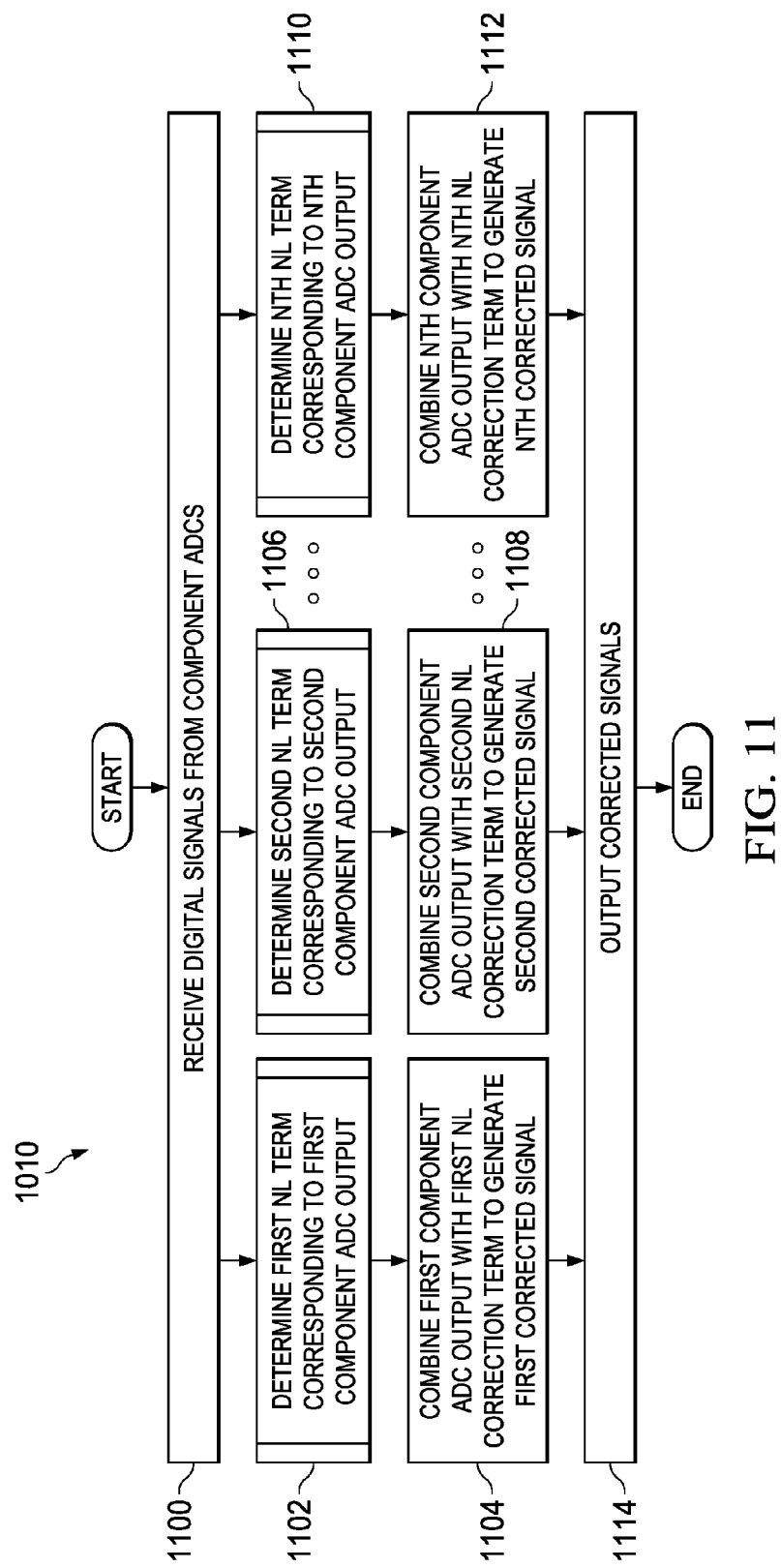
FIG. 11 is a flowchart representative of example machine readable instructions that may be executed to implement the example NL corrector of FIG. 5.

FIG. 11 is an example flowchart 1010 representative of example machine readable instructions that may be executed to implement the example NL corrector 210 of FIGS. 2 and 6 to reduce non-linearity and non-linearity mismatch of the example digital signal 209 to generate the example corrected signal 211 of FIGS. 2 and 6. Although the example flowchart 1210 corresponds to the example NL corrector 210 of FIGS. 2 and 6, the example flowchart 1010 may be utilized for any type of NL correction device.

At block 1100, the example NL corrector 110 receives the example digital signal 209a-n output by the example ADC 208. The example digital signal 209a-n is a digital representation of an analog signal (e.g., received by the example signal receiver 102 of FIG. 2) sampled at different points in time. As described above, the example interleaved ADC 208 generates undesired non-linearity and non-linearity mismatch in the digital signal 209a-n.

At block 1102, the first example sub-NL corrector 500 determines a first NL correction term corresponding to the first example component ADC output 209a. In some examples, the first sub-NL corrector 500 determines the NL correction term based on the Volterra terms. Alternatively, as further described below in conjunction with FIG. 12, the first sub-NL, corrector 500 determines the NL, correction term based on a combination of (A) Volterra terms corresponding to the example component ADC outputs 209a-n scaled by the first example NL coefficients 501 and (B) cross NL correction terms which use both component ADC outputs 209a-n and the derivative scaled by the first example NL coefficients 501. At block 1104 the example summer 508 combines (e.g., subtracts) the first example component ADC output 209a with the first NL correction term to generate first example corrected signal 211a. An example first corrected term is described above in conjunction with Equation 10.

At block 1106, the second example sub-NL corrector 502 dote nines a second NL correction term corresponding to the second example component ADC output 209b. In some examples, the second sub-NL corrector 502 determines the NL correction term based on the Volterra terms. Alternatively, as further described below in conjunction with FIG. 12, the second sub NL corrector 502 determines the NL correction term based on a combination of (A) Volterra terms corresponding to the example component ADC outputs 209a-n scaled by the second example NL coefficients 503 and (B) cross NL correction terms which use both component ADC outputs 209a-n and their derivative scaled by the second example NL coefficients 503. At block 1104 the example summer 510 combines (e.g., subtracts) the second example component ADC output 209b with the second NL correction term to generate second example corrected terms 211b. An example second corrected term is described above in conjunction with Equation 11.

At block 1110, the nth example sub-NL corrector 506 determines a nth NL correction term corresponding to the nth example component ADC output 209n. In some examples, the nth sub-NL corrector 506 determines the nth NL correction term based on the Volterra terms. Alternatively, as further described below in conjunction with FIG. 12, the nth sub-NL corrector 506 determines the nth NL correction term based on a combination of (A) Volterra terms corresponding to the example component ADC outputs 209a-n scaled by the nth example NL coefficients 507 and (B) cross NL terms which use both component ADC outputs 209a-n and their derivative scaled by the nth example NL coefficients 507. At block 1104, the example summer 514 combines (e.g., subtracts) the nth example component ADC output 209n with the nth NL correction term to generate nth example corrected terms 211n. At block 1114, the example summers 508, 510, . . . , 514 output the example corrected signals 211a-n.

Figure 12:
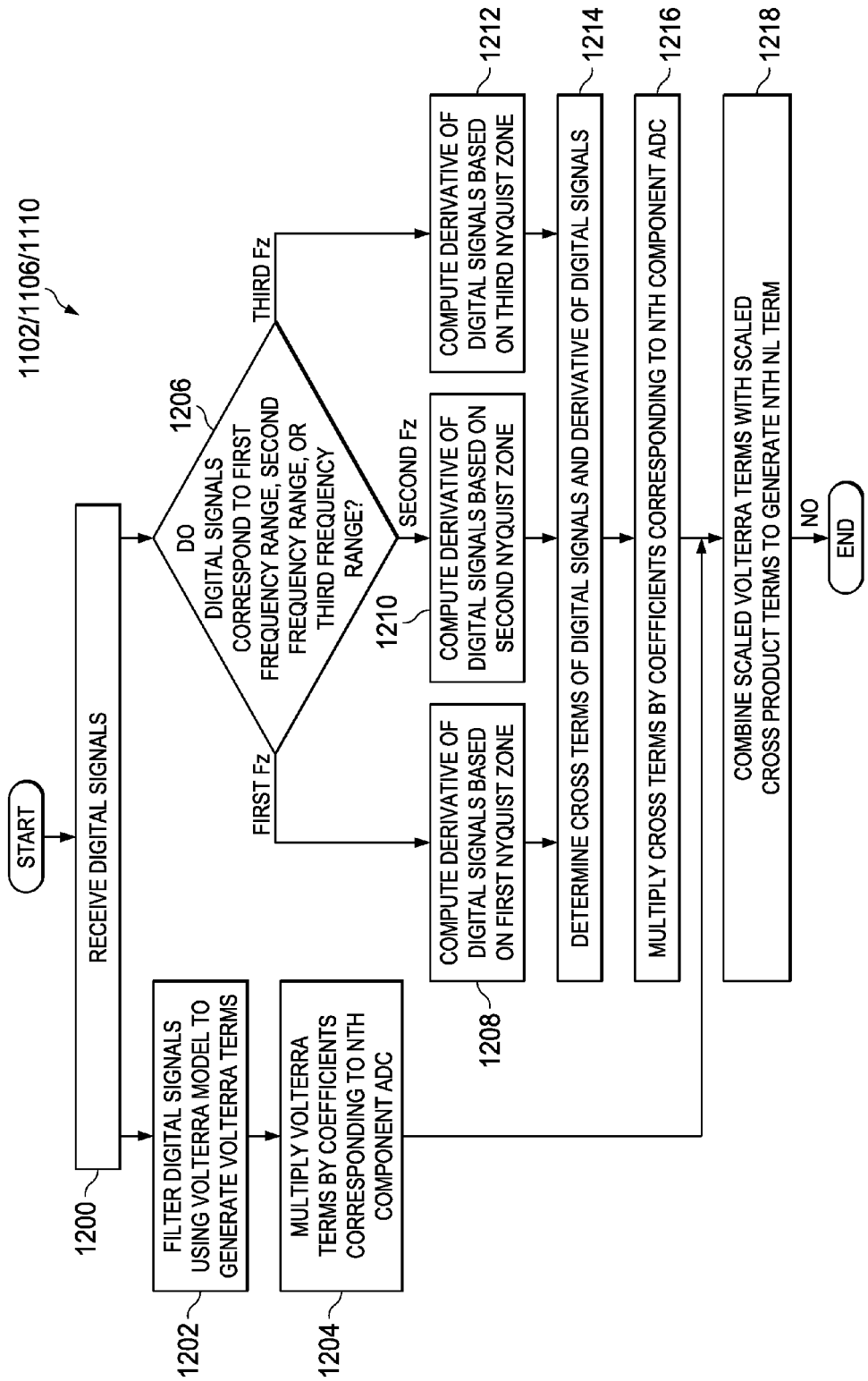
FIG. 12 is a flowchart representative of example machine readable instructions that may be executed to implement the example NL corrector of FIG. 6.

FIG. 12 is an example flowchart 1102, 1106, 1110 representative of example machine readable instructions that may be executed to implement the example NL corrector 210 of FIGS. 2 and 6 to reduce non-linearity and non-linearity mismatch of the example digital signals 209a-n to generate the example corrected signals 211a-n of FIGS. 2 and 6. Although the example flowchart 1102, 1106, 1110 corresponds to the example NL corrector 210 of FIGS. 2 and 6, the example flowchart 1102, 1106, 1110 may be utilized for any type of NL correction device. The flowchart 1102, 1106, 1110 may be used by any one of the example sub-NL correctors 500, 502, 504, 506 of FIG. 5.

At block 1200, the example NL corrector 110 receives the example digital signals 209a-n output by the example interleaved ADC 208. The example digital signals 209a-n are digital representation of an analog signal (e.g., received by the example signal receiver 102 of FIG. 1) sampled at different points in time (e.g., for a ADC with four component ADCS, x(4n), x(4n+1), x(4n+2), x(4n+3)). As described above, the example interleaved ADC 208 generates undesired non-linearity and non-linearity mismatch in the digital signals 209a-n. As illustrated in the example NL corrector 210 of FIG. 6, the received digital signal 209a-n is distributed to the example Volterra model filter 600, the example derivative filter 606, and the example cross products determiner 608.

At block 1202, the example Volterra model filter 600 filters the received digital signals 209a-n using a Volterra model (e.g., of any order) to generate Volterra terms. At block 1204, the example multiplier set 602 multiplies (e.g., scales) the generated Volterra terms by corresponding NL coefficients corresponding to the nth component ADC. For example, if the flowchart 1102, 1106, 1110 corresponds to the first example sub-NL corrector 500, the corresponding NL, coefficients are the example NL coefficients 501 corresponding to the characteristics of the first example component ADC 402a. In some examples, the scaled Volterra terms (V(n)) for a four component ADC are equivalent to the Equations 13-16, in an example second order Volterra model for a ADC with four component ADCs.

$$V_1(4n)=\alpha^1 x^3(4n)+\Omega^1 {}^* x(4n)^* x^2(4n-1) \quad \text{(Equation 13)}$$

$$V_2(4n+1)=\alpha^2 x^3(4n+1)+\Omega^2 {}^* x(4n+1)^* x^2(4n) \quad \text{(Equation 14)}$$

$$V_3(4n+2)=\alpha^3 x^3(4n+2)+\Omega^3 {}^* x(4n+2)^* x^2(4n+1) \quad \text{(Equation 15)}$$

$$V_4(4n+3)=\alpha^4 x^3(4n+3)+\Omega^4 {}^* x(4n+3)^* x^2(4n+2) \quad \text{(Equation 16)}$$

At block 1206, the example Nyquist zone provider 604 determines if the digital signals 209a-n correspond to a first frequency range, a second frequency range, or a third frequency range. In some examples, there may be more or less frequency ranges identified by the example Nyquist zone provider 604. If the example Nyquist zone provider 604 determines that the frequency of the digital signals 209a-n corresponds to the first frequency range, the example derivative filter 606 computes the derivative of the digital signal 209a-n based on the first Nyquist zone (e.g., the first example Nyquist zone 700 of FIG. 7) (block 1208). If the example Nyquist zone provider 604 determines that the frequency of the digital signals 209a-n correspond to the second frequency range, the example derivative filter 206 computes the derivative of the digital signals 209a-n based on the second Nyquist zone (e.g., the second example Nyquist zone 702 of FIG. 7) (block 1210). If the example Nyquist zone provider 604 determines that the frequency of the digital signals 209a-n correspond to the third frequency range, the example derivative filter 206 computes the derivative of the digital signal 109 based on the third Nyquist zone (e.g., the third example Nyquist zone 704 of FIG. 7) (block 1212).

At block 1214, the example cross terms determiner 608 determines the cross NL correction terms which use both the example digital signals 209a-n and the derivative of the digital signals output by the example derivative filter 606. At block 1216, the example multiplier set 610 multiplies (e.g. scales) the cross terms by corresponding NL coefficients (e.g., the first example NL coefficients 501 for the first example component ADC 402a, the second example NL coefficients 503 for the second example component ADC 402b, etc.). In some examples, the scaled cross terms (CP) are equivalent to the Equations 17-20, in example second order derivatives for a four component ADC.

$$CP_1=\beta^1 x'(4n) x^2(4n-1) \quad \text{(Equation 17)}$$

$$CP_2=\beta^2 x'(4n+1) x^2(4n) \quad \text{(Equation 18)}$$

$$CP_3=\beta^3 x'(4n+2) x^2(4n+1) \quad \text{(Equation 19)}$$

$$CP_4=\beta^4 x'(4n+3) x^2(4n+2) \quad \text{(Equation 20)}$$

Where x'(4n) is the derivative of the first example ADC output 209a, x'(4n+1) is the derivative of the second example digital signal 209b, x'(4n+2) is the derivative of the third example digital signal 209c, and x'(4n+3) is the derivative of the fourth example digital signal 209d.

At block 1218, the example summer 612 combines the scaled cross terms with the example scaled Volterra terms to generate a nth NL correction term. Using the above example terms from Equations 13-20, an example NL correction terms of a four component ADC is shown in Equation 21-24.

$$NL_{term1} = \alpha^1 x^3(4n) + \Omega^1 * x(4n) * x^2(4n-1) + \beta^1 x'(4n) x^2(4n-1)$$ (Equation 21)

$$NL_{term2} = \alpha^2 x^3(4n+1) + \Omega^2 * x(4n+1) * x^2(4n) + \beta^2 x'(4n+1) x^2(4n)$$ (Equation 22)

$$NL_{term3} = \alpha^3 x^3(4n+2) + \Omega^3 * x(4n+2) * x^2(4n+1) + \beta^3 x'(4n+2) x^2(4n+1)$$ (Equation 23)

$$NL_{term4} = \alpha^4 x^3(4n+3) + \Omega^4 * x(4n+3) * x^2(4n+2) + \beta^4 x'(4n+3) x^2(4n+2)$$ (Equation 24)

The NL correction terms are representative of the undesired non-linearity and non-linearity mismatch of the example digital signal 209a-n.

Figure 14:
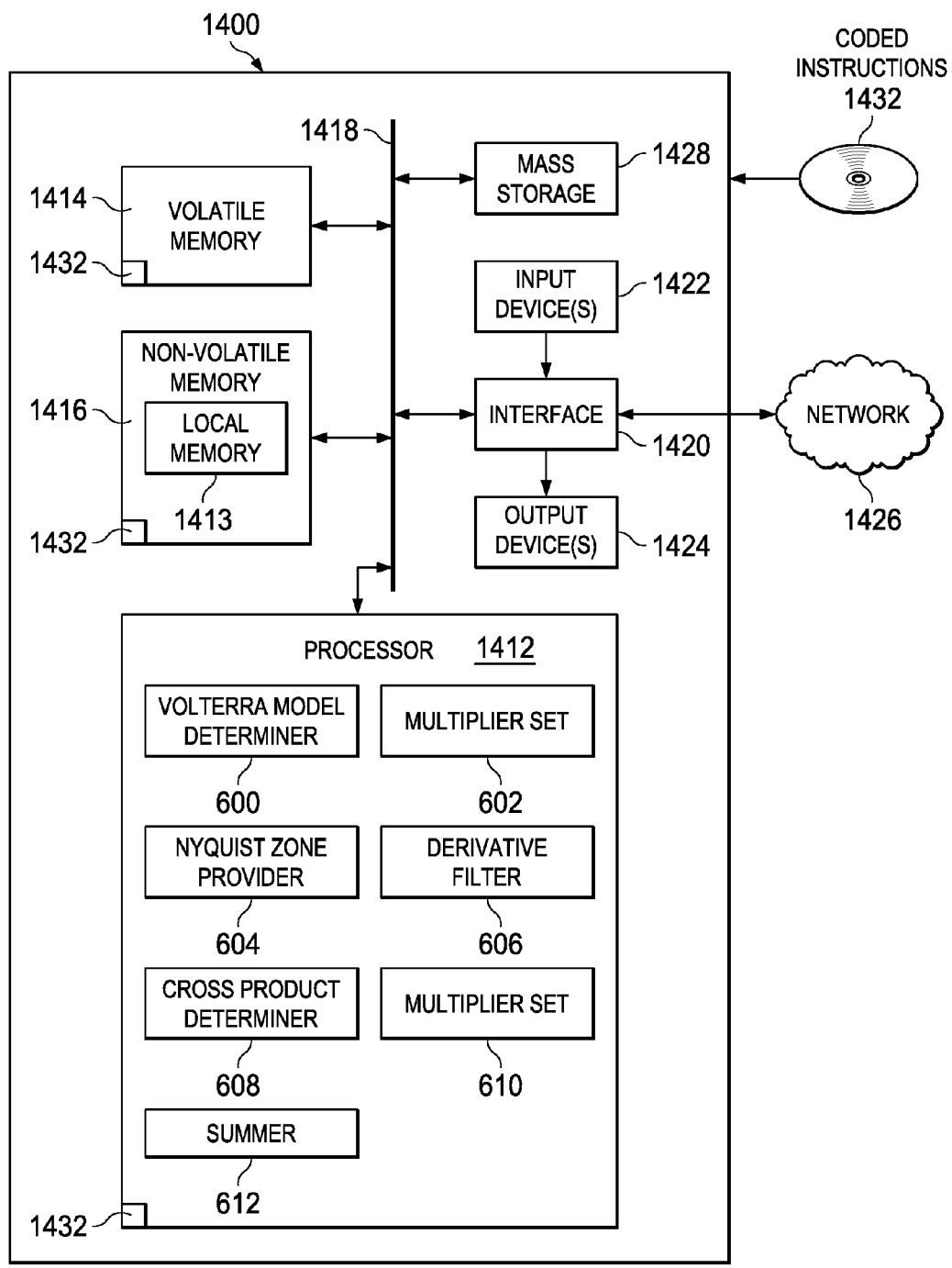
FIG. 14 is an example processor platform that may execute the example computer readable instructions of FIGS. 8-9 to implement the example NL corrector of FIGS. 1 and 3.

FIG. 14 is a block diagram of an example processor platform 1400 capable of executing the instructions of FIGS. 8 and 9 to implement the example sampling architecture 100 and/or the example NL corrector 110 of FIGS. 1 and 3. The processor platform 1400 can be, for example, a server, a personal computer, a mobile device (e.g., a cell phone, a smart phone, a tablet such as an iPad™), a personal digital assistant (PDA), an Internet appliance, or any other type of computing device.

The processor platform 1400 of the illustrated example includes a processor 1412. The processor 1412 of the illustrated example is hardware. For example, the processor 1412 can be implemented by integrated circuits, logic circuits, microprocessors or controllers from any desired family or manufacturer.

The processor 1412 of the illustrated example includes the example memory 1413 (e.g., a cache). The example processor 1412 of FIG. 14 executes the instructions of FIGS. 8 and 9 to implement the example signal receiver 102, the example amplifier 104, the example bandpass filter 106, the example ADC 108, the example NL corrector 110, the example digital converter 112, the example Volterra model filter 300, the example multiplier set 302, the example Nyquist zone provider 304, the example derivative filter 306, the example cross terms determiner 308, the example multiplier set 310, and/or the example summers 312, 314 of FIGS. 1 and/or 3. The processor 1412 of the illustrated example is in communication with a main memory including a volatile memory 1414 and a non-volatile memory 1416 via a bus 1418. The volatile memory 1414 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1416 may be implemented by flash memory and/or any other desired type of memory device. Access to the main memory 1414, 1416 is controlled by a memory controller.

The processor platform 1400 of the illustrated example also includes an interface circuit 1420. The interface circuit 1420 may be implemented by any type of interface standard, such as an Ethernet interface, a universal serial bus (USB), and/or a PCI express interface.

In the illustrated example, one or more input devices 1422 are connected to the interface circuit 1420. The input device(s) 1422 permit(s) a user to enter data and commands into the processor 1412. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 1424 are also connected to the interface circuit 1420 of the illustrated example. The output devices 1424 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 1420 of the illustrated example, thus, typically includes a graphics driver card, a graphics driver chip or a graphics driver processor.

The interface circuit 1420 of the illustrated example also includes a communication device such as a transmitter, a receiver, a transceiver, a modem and/or network interface card to facilitate exchange of data with external machines computing devices of any kind) via a network 1426 (e.g., an Ethernet connection, a digital subscriber line (DSL), a telephone line, coaxial cable, a cellular telephone system, etc.).

The processor platform 1400 of the illustrated example also includes one or more mass storage devices 1428 for storing software and/or data. Examples of such mass storage devices 1428 include floppy disk drives, hard drive disks, compact disk drives, Blu-ray disk drives, RAID systems, and digital versatile disk (DVD) drives.

The coded instructions 1432 of FIGS. 8 and 9 may be stored in the mass storage device 1428, in the volatile memory 1414, in the non-volatile memory 1416, and/or on a removable tangible computer readable storage medium such as a CD or DVD.

Figure 15:
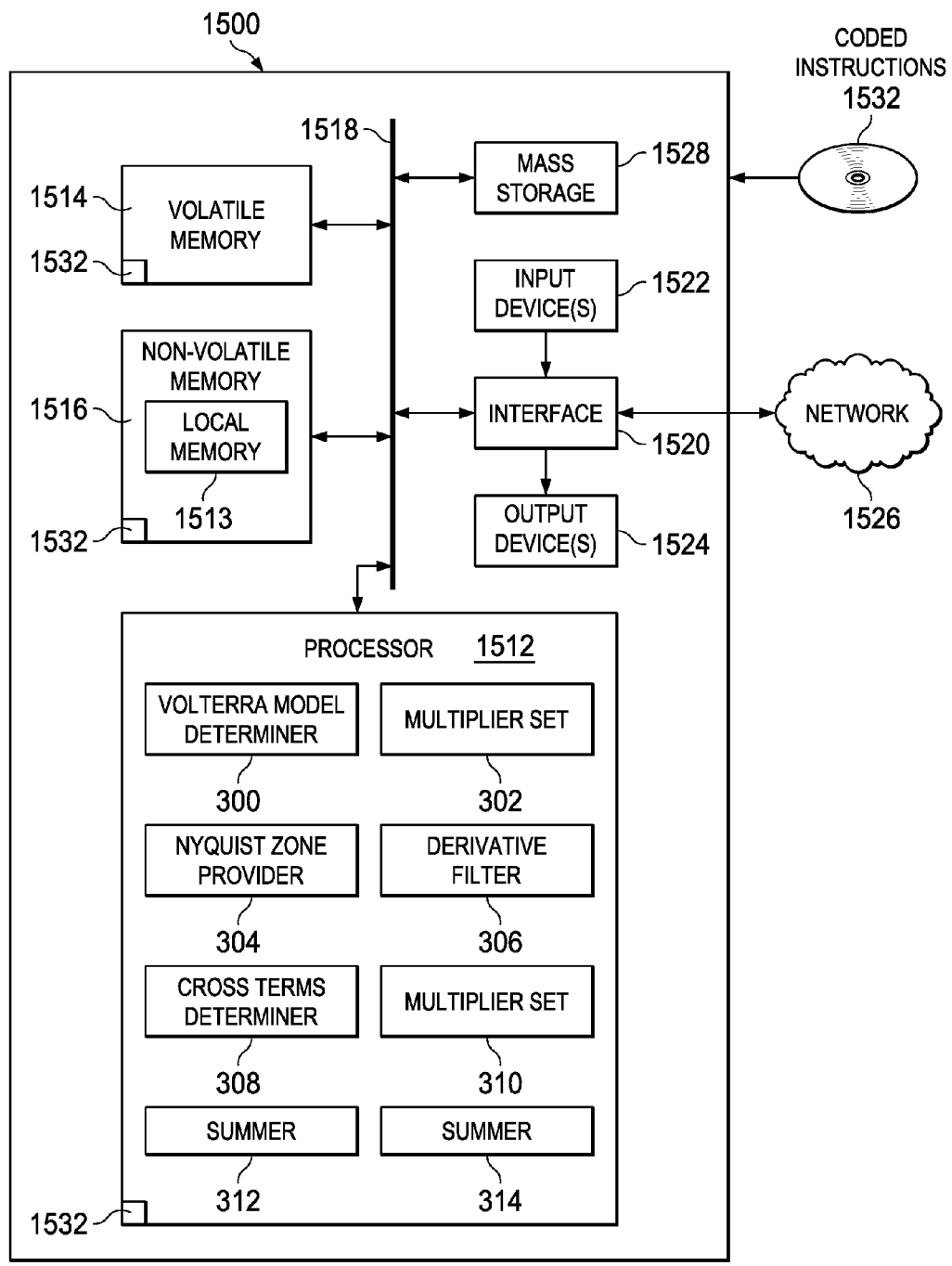
FIG. 15 is an example processor platform that may execute the example computer readable instructions of FIGS. 10-12 to implement the example NL corrector of FIGS. 2, 5, and 6.

FIG. 15 is a block diagram of an example processor platform 1500 capable of executing the instructions of FIGS. 10 and 11 to implement the example interleaved sampling architecture 200 and/or the example NL corrector 210 of FIGS. 2 and 6. The processor platform 1500 can be, for example, a server, a personal computer, a mobile device (e.g., a cell phone, a smart phone, a tablet such as an iPad™), a personal digital assistant (PDA), an Internet appliance, or any other type of computing device.

The processor platform 1500 of the illustrated example includes a processor 1512. The processor 1512 of the illustrated example is hardware. For example, the processor 1512 can be implemented by integrated circuits, logic circuits, microprocessors or controllers from any desired family or manufacturer.

The processor 1512 of the illustrated example includes the example memory 1513 (e.g., a cache). The example processor 1512 of FIG. 15 executes the instructions of FIGS. 10 and 11 to implement the example signal receiver 102, the example amplifier 104, the example bandpass filter 106, the example ADC 208, the example NL corrector 210, the example IL corrector 212, the example digital converter 214, the example Volterra model filter 600, the example multiplier set 602, the example Nyquist zone provider 604, the example derivative filter 606, the example cross terms determiner 608, the example multiplier set 610, and/or the example summers 612, 508 of FIGS. 2 and/or 6. The processor 1512 of the illustrated example is in communication with a main memory including a volatile memory 1514 and a non-volatile memory 1516 via a bus 1518. The volatile memory 1514 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1516 may be implemented by flash memory and/or any other desired type of memory device. Access to the main memory 1514, 1516 is controlled by a memory controller.

The processor platform 1500 of the illustrated example also includes an interface circuit 1520. The interface circuit 1520 may be implemented by any type of interface standard, such as an Ethernet interface, a universal serial bus (USB), and/or a PCI express interface.

In the illustrated example, one or more input devices 1522 are connected to the interface circuit 1520. The input device(s) 1522 permit(s) a user to enter data and commands into the processor 1512. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 1524 are also connected to the interface circuit 1520 of the illustrated example. The output devices 1524 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 1520 of the illustrated example, thus, typically includes a graphics driver card, a graphics driver chip or a graphics driver processor.

The interface circuit 1520 of the illustrated example also includes a communication device such as a transmitter, a receiver, a transceiver, a modem and/or network interface card to facilitate exchange of data with external machines (e.g., computing devices of any kind) via a network 1526 (e.g., an Ethernet connection, a digital subscriber line (DSL), a telephone line, coaxial cable, a cellular telephone system, etc.).

The processor platform 1500 of the illustrated example also includes one or more mass storage devices 1528 for storing software and/or data. Examples of such mass storage devices 1528 include floppy disk drives, hard drive disks, compact disk drives, Blu-ray disk drives, RAID systems, and digital versatile disk (DVD) drives.

The coded instructions 1532 of FIGS. 10-12 may be stored in the mass storage device 1528, in the volatile memory 1514, in the non-volatile memory 1516, and/or on a removable tangible computer readable storage medium such as a CD or DVD.

From the foregoing, it would be appreciated that the above disclosed method, apparatus, and articles of manufacture reduce non-linearity and/or non-linearity mismatch in analog to digital converters. Examples disclosed herein includes NL corrector to reduce non-linearity and/or non-linearity mismatch in digital signals output by the ADC (e.g., interleaving or non-interleaving). In some examples, the NL corrector combines Volterra terms with the cross product of the digital signal(s) and the derivative of the digital signal(s) to output a NL term. The NL term is removed from the digital signal(s) to reduce the non-linearity and/or non-linearity mismatch of the digital signal. In some examples, the NL corrector includes multiple sub-NL correctors corresponding to multiple component ABCs to include NL mismatch corresponding to memory effects at full rate across a wide band. In some examples, NL correction is done prior to IL correction to prevent NL bias in the IL correction. Using examples disclosed herein, NL and NL mismatch correction is capable of modelling memory effects at a full rate over a wide band. Examples disclosed herein provide a 90%-point improvement by 25 decibels (dB) for IMD3 and 20 dB for HD3. Additionally, examples disclosed herein provide a worst case improvement of 14 dB for IMD3 and 19 dB for HD3 over a wide band (e.g., 1.65-2.85 GHz for 4 GHz sampling rate).

This patent claims priority from Indian Patent Application number 201641015443, which was filed on May 4, 2016, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

What is claimed is:

1. An apparatus comprising:
an analog-to-digital converter to convert an analog signal into a digital signal; and
a non-linearity corrector coupled to the analog-to-digital converter to:
determine a derivative of the digital signal;
determine cross terms including a combination of the digital signal and the derivative of the digital signal;
determine Volterra terms of the digital signal; and
determine a non-linearity term corresponding to the cross terms and to the Volterra terms.

2. The apparatus of claim 1, further including a summer coupled to the non-linearity corrector to combine the non-linearity term with the digital signal.

3. The apparatus of claim 2, wherein the summer combines the non-linearity term with the digital signal to reduce non-linearity of the digital signal.

4. The apparatus of claim 1, wherein the non-linearity corrector is to scale the cross terms and the Volterra terms by first non-linearity coefficients corresponding to characteristics of the analog-to-digital converter.

5. The apparatus of claim 1, wherein the digital signal includes a first signal corresponding to first samples at first points in time and a second signal corresponding to second samples at second points in time different from the first points in time.

6. The apparatus of claim 5, wherein the analog-to-digital converter is an interleaved analog-to-digital converter including a first and second component ADC, the first component ADC to output the first signal and the second component ADC to output the second signal.

7. The apparatus of claim 6, wherein:
the first component ADC corresponds to a first non-linearity term and the second component ADC corresponds to a second non-linearity term; and
the first and second component ADCs correspond to a non-linearity mismatch generated by the interleaved analog-to-digital converter.

8. The apparatus of claim 6, wherein the non-linearity corrector is to scale the cross terms and the Volterra terms by second non-linearity coefficients corresponding to characteristics of at least one of the first component ADC or the second component ADC.

9. The apparatus of claim 6, wherein:
the first component ADC determines the Volterra terms based on the first signal and the second signal; and
the first component ADC determines the derivative of the digital signal based on the first signal and the second signal, the cross terms being based on the first signal and the second signal.

10. The apparatus of claim 1, wherein the non-linearity corrector is to determine the derivative of the digital signal based on a Nyquist zone corresponding to a frequency of the analog signal.

11. The apparatus of claim 1, wherein the cross terms are non-linearity terms.

12. An apparatus comprising:
an interleaved analog-to-digital converter including:
a first component ADC to convert an analog signal into a first digital signal corresponding to first samples at first points in time; and
a second component ADC to convert the analog signal into a second digital signal corresponding to second samples at second points in time different from the first points in time; and
a non-linearity corrector coupled to the interleaved analog-to-digital converter to:
determine a first non-linearity term corresponding to at least one of the first and second digital signals, wherein the non-linearity corrector is to determine the first non-linearity term by determining Volterra terms of the first and second digital signals, the Volterra terms scaled by first non-linearity coefficients corresponding to the first component ADC; and
combine the first non-linearity term with the first digital signal to reduce non-linearity of the first digital signal.

13. The apparatus of claim 12, wherein the non-linearity corrector is to:
determine a second non-linearity term corresponding to Volterra terms of the first and second digital signals, the Volterra terms scaled by second non-linearity coefficients corresponding to a second component ADC; and
combine the second non-linearity term with the second digital signal to reduce second non-linearity of the second digital signal.

14. The apparatus of claim 13, further including an interleaving mismatch corrector to perform interleaving mismatch correction on the first and second digital signals after the first and second non-linearities have been reduced from the first and second digital signals.

15. The apparatus of claim 12, wherein combining the first non-linearity term with the first digital signal reduces non-linearity mismatch of the first digital signal.

16. The apparatus of claim 12, wherein the non-linearity corrector is to determine cross terms corresponding to the first digital signal, the second digital signal, and a derivative corresponding to the first digital signal and the second digital signal, the first non-linearity term including the cross terms.

17. The apparatus of claim 16, wherein the cross terms are scaled by first non-linearity coefficients.

18. The apparatus of claim 16, wherein the non-linearity corrector is to combine Volterra terms corresponding to at least one of the first digital signal or the second digital signal and the cross terms to determine the first non-linearity term.

* * * * *